United States Patent [19]
Kosaki

[11] Patent Number: 5,998,238
[45] Date of Patent: Dec. 7, 1999

[54] METHOD OF FABRICATING SEMICONDUCTOR DEVICE

[75] Inventor: Katsuya Kosaki, Itami, Japan

[73] Assignee: Mitsubishi Denki Kabushiki Kaisha, Tokyo, Japan

[21] Appl. No.: 09/093,059

[22] Filed: Jun. 8, 1998

Related U.S. Application Data

[62] Division of application No. 08/547,928, Oct. 25, 1995, Pat. No. 5,872,396.

[30] Foreign Application Priority Data

Oct. 26, 1994 [JP] Japan .................................. 6-262499

[51] Int. Cl.$^6$ .................................................. H01L 23/24
[52] U.S. Cl. ........................ 438/114; 438/113; 438/122; 438/462; 438/464; 438/465
[58] Field of Search .................................. 438/114, 122, 438/462, 464, 113, 465; 257/712

[56] References Cited

U.S. PATENT DOCUMENTS

| | | | |
|---|---|---|---|
| 5,037,782 | 8/1991 | Nakamura et al. | 437/902 |
| 5,275,958 | 1/1994 | Ishikawa | 438/462 |
| 5,302,554 | 4/1994 | Kashiwa et al. | 438/462 |
| 5,338,967 | 8/1994 | Kosaki | 257/620 |
| 5,362,678 | 11/1994 | Komaru et al. | 437/203 |
| 5,457,072 | 10/1995 | Tamaki et al. | 438/464 |

FOREIGN PATENT DOCUMENTS

| | | |
|---|---|---|
| 61-59824 | 3/1986 | Japan . |
| 215652 | 1/1990 | Japan . |
| 2253642 | 10/1990 | Japan . |
| 2260443 | 10/1990 | Japan . |
| 4313503 | 6/1991 | Japan . |
| 536874 | 2/1993 | Japan . |
| 6112236 | 4/1994 | Japan . |

*Primary Examiner*—Donald Monin
*Assistant Examiner*—Michael Dietrich
*Attorney, Agent, or Firm*—Leydig, Voit & Mayer, Ltd.

[57] ABSTRACT

A method of fabricating a semiconductor device includes forming a first chip separating groove such that its depth is less than the total depth of the wafer, forming a first metallization layer inside the first chip separating groove, thinning the wafer, forming a second chip separating groove in a region opposite the first chip separating groove of the rear surface of the wafer so that the wafer is separated into a plurality of semiconductor chips, forming metallization layer inside the second chip separating groove, forming a PHS layer on the entire rear surface of the wafer, and cutting the wafer at the chip separating groove, thereby producing a semiconductor device. The burr produced when the wafer is cut does not protrude from the rear surface of the wafer, assuring good adhesion between the semiconductor chip and a chip carrier, realizing a semiconductor device of a good heat dispersion characteristic and, therefore, of high reliability.

31 Claims, 17 Drawing Sheets

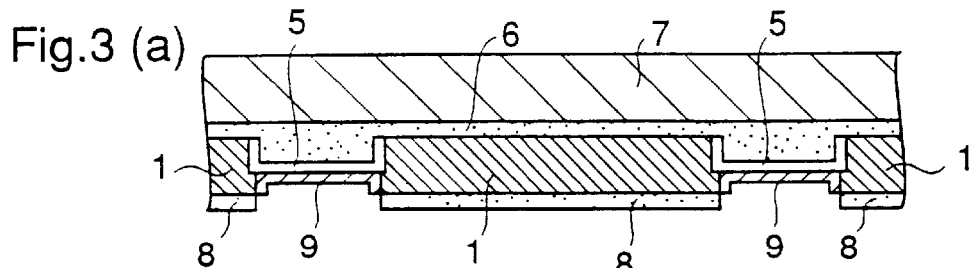
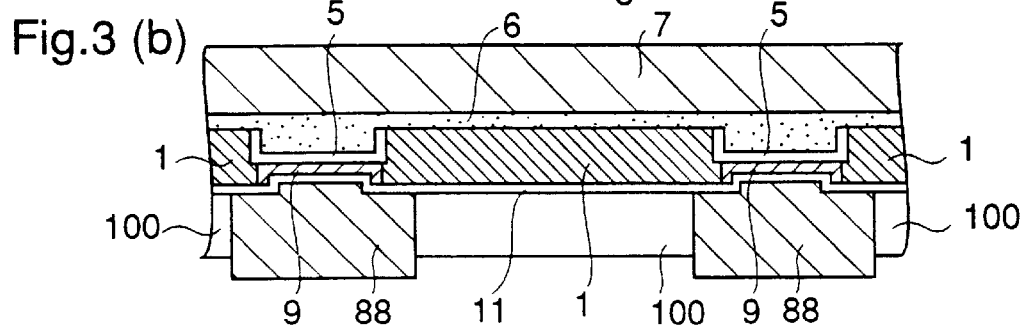
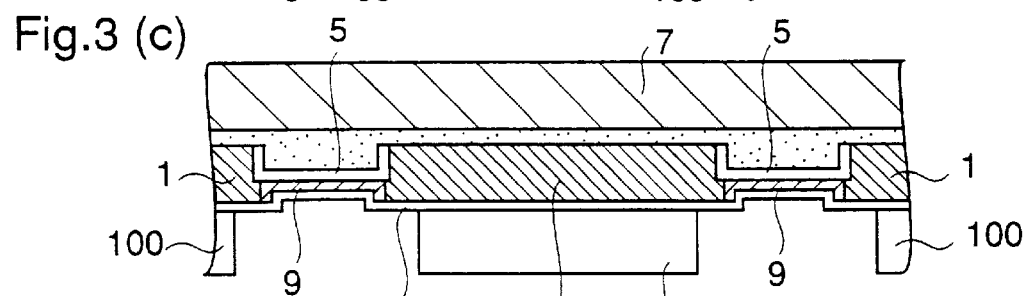
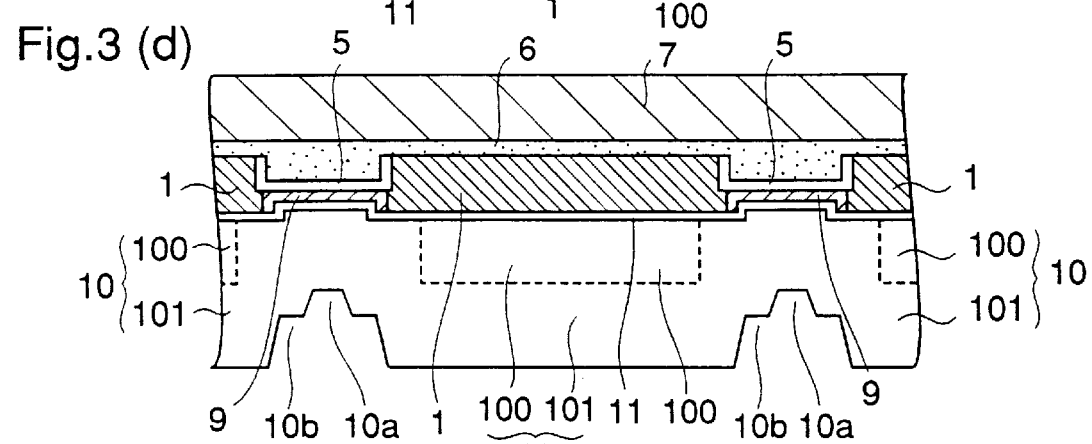
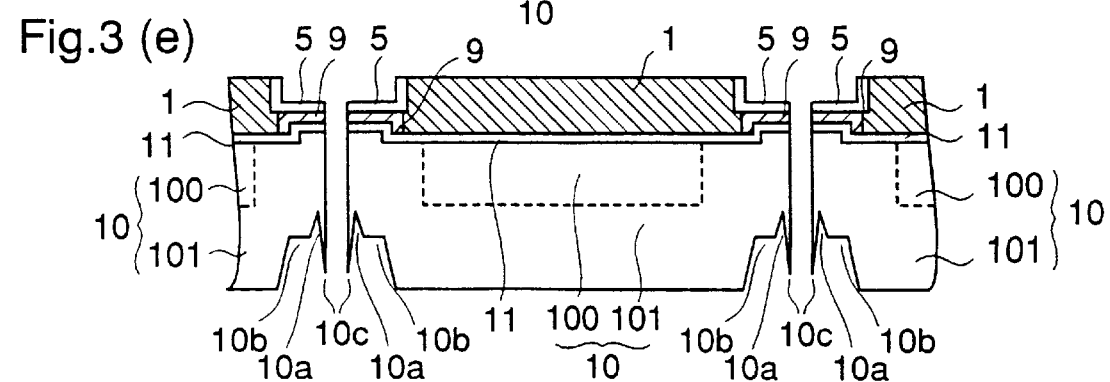

METHOD OF FABRICATING SEMICONDUCTOR DEVICE

This disclosure is a division of patent application Ser. No. 08/547,928, filed on Oct. 25, 1995 now U.S. Pat. No. 5,872,396.

FIELD OF THE INVENTION

This invention relates to a method of fabricating a semiconductor device having a PHS (plated heat sink) layer for heat dispersion on a rear surface of a semiconductor chip, and a semiconductor device fabricated thereby.

BACKGROUND OF THE INVENTION

FIGS. 17(a)–17(d) are cross-sectional views illustrating a method of fabricating a prior art high frequency high output semiconductor device having a plated heat sink (referred to as PHS hereinafter) layer on a rear surface of a semiconductor chip disclosed in Japanese Published Patent Application No. Hei 6-209058. First, after a photoresist 4 having an opening in a chip separating region is formed on the surface of a semiconductor substrate 1 where a plurality of semiconductor elements are formed, the semiconductor substrate 1 is etched by reactive ion etching (RIE) or the like using the photoresist as a mask, thereby forming a chip separating groove 2 of a depth of 25–30 µm. Meanwhile, the etching proceeds not only in the depth direction but also in the lateral direction to some degree, resulting in an etching 3 under the photoresist. Next, the metallization layer 5 is disposed on the entire surface of the wafer using vacuum evaporation or sputtering deposition (FIG. 17(a)). Next, by removing the photoresist 4, the metallization layer 5 is left only on the internal surface of the chip separation groove 2. This is easily accomplished because of the under cut 3. Next, after the resist 44 is formed on the surface of the semiconductor substrate except the chip separating groove, the plating layer 55 of a thickness of about 5 µm is formed only inside the chip separating groove by electrolytic plating using the metallization layer 5 as an electrical supply layer (FIG. 17(b)). This plating layer is to keep these semiconductor chips mechanically joined after the semiconductor substrate is separated into semiconductor chips by polishing the rear surface of the substrate, which will be described later, and a thickness of about 5 µm is required as described above. Next, the surface of the semiconductor substrate 1 is adhered to the glass plate 7 using the wax 6 (FIG. 17(c)). Furthermore, the semiconductor substrate 1 is polished on the rear surface side until the bottom of the metallization layer is exposed (FIG. 17(d)). The thickness of the semiconductor substrate 1 is thus made 25–30 µm which is almost the same as the depth of the chip separating groove, whereby the semiconductor substrate is separated into the semiconductor chips. Next, after a PHS layer comprising Au of 40–50 µm thickness is formed on the entire surface of the rear surface side of the semiconductor substrate 1, the glass plate 7 is removed from the semiconductor substrate 1 by removing the wax 6 and the wafer is washed. Furthermore, the surface of the PHS layer opposite the semiconductor substrate side is adhered to an expand film and dicing is performed. That is, the wafer is cut at the PHS layer in the chip separating groove region with a dicing blade.

Using the fabricating method described above, the semiconductor device comprising the semiconductor chip having a semiconductor element formed on its front surface and the PHS layer formed on its rear surface is obtained. This PHS layer is a heat dispersing body for dispersing heat produced in the semiconductor element such as a field effect transistor or the like formed on the surface of the semiconductor chip. This PHS layer also simplifies handling of the thin semiconductor substrate after the removal of the glass plate or the semiconductor chip after dicing.

In the above fabricating method, when the chip separating groove 2 is formed using RIE, the peripheral region of the front surface of the semiconductor substrate 1 is shielded by a susceptor ring or the like which holds the substrate, and the chip separating groove is not formed in this region. Because of this shielding, the plating layer in this region becomes a plating protrusion on the front surface of the semiconductor substrate in the subsequent plating layer formation process. If the glass plate is adhered to the substrate surface with the wax in this condition, a crack 1c occurs in the semiconductor substrate under the plating protrusion 555 as illustrated in FIG. 18. And, even for the region where the chip separating groove 2 is properly formed and the metallization layer 5 and the plating layer 55 are formed on the internal surface of the chip separating groove 2, in a step of polishing the rear surface of the semiconductor substrate until the bottom of the metallization layer 5 is exposed, the chip separating groove, which is deeper than other chip separating grooves, is polished even after the bottom of the metallization layer 5 is exposed, resulting in the rupture 5d of the metallization layer 5 and the further rupture 55a of the plating layer 55 as shown in FIG. 19. Even in a case in which these ruptures do not occur, as the metallization layer 5 protrudes from the polished rear surface of the semiconductor substrate, a subsequent photolithography process becomes very difficult. Furthermore, burrs are produced at a section of the PHS layer (protrusion of the PHS layer toward the rear surface side of the semiconductor substrate) in the dicing process (step of cutting the PHS layer). These burrs fully protrude from the rear surface of the PHS layer and this considerably deteriorates the adhesion between the PHS layer and a chip carrier, degrading heat conduction from the PHS layer to the chip carrier.

As a fabricating method of a semiconductor device which is intended to avoid the above difficulties, the fabricating method disclosed in U.S. Pat. No. 5,275,958 is devised. This method is described as follows. FIGS. 20(a)–20(h) are cross-sectional views illustrating this method in the processing order. First, after the surface protection film 200 is formed on the region of the front surface of the semiconductor substrate 1 which is about 600 µm thickness where semiconductor elements are formed, the first chip separating groove 2 of a depth of 5–15 µm is formed on the front surface of the semiconductor substrate 1 by etching (FIG. 20(a)). Next, the first chip separating groove plating layer 51 of a thickness of about 10 µm and comprising Au is formed inside this first chip separating groove 2 (FIG. 20(b)), and the glass plate 7 is attached to the front surface of the semiconductor substrate 1 by the wax 6 (FIG. 20(c)). Furthermore, by etching the rear surface of the semiconductor substrate 1 in a region opposite to the first chip separating groove 2 until the bottom of the first chip separating groove plating layer 51 is exposed, the second chip separating groove 22 is formed (FIG. 20(d)). Next, the photoresist 8 is formed on the rear surface of the semiconductor substrate 1 except the region of the second chip separating groove 22 and, using this photoresist as a mask, the second chip separating groove plating layer 52 of a thickness of about 10 µm and comprising Au is formed inside the second chip separating groove 22 (FIG. 20(e)). Furthermore, after the photoresist 8 is removed, the semiconductor substrate 1 is thinned to a thickness of 20–30 µm by polishing the rear surface of the substrate. When the substrate is thinned, since the second chip separating groove plating layer 52 is also polished simultaneously, the structure where the second chip separating groove plating layer 52 is formed only inside the second chip separating groove 22 which is left after the polishing as illustrated in FIG. 20(f) is obtained. Next, the PHS layer 10 of a thickness of 40–60 μm is formed on the rear surface of the semiconductor substrate 1 except for the region of the second chip separating groove 22 (FIG. 20(g)). Then, by melting and removing the wax 6, the glass plate 7 is removed from the semiconductor substrate 1, and the surface of the PHS layer 10 opposite the semiconductor substrate side is adhered to the dicing tape 300. Finally, by cutting the first and the second chip separating groove plating layers, the semiconductor device comprising the semiconductor chip having a semiconductor element formed on its front surface and the PHS layer formed on its rear surface is obtained (FIG. 20(h)). Although the burrs 52a (portion of the plating layer bending toward the rear surface side of the semiconductor substrate in the figure) are produced in the cutting process, these burrs do not protrude from the surface of the PHS layer opposite the semiconductor substrate side, and consequently, the adhesion between the PHS layer and a chip carrier becomes excellent in a subsequent step of mounting the semiconductor device onto the chip carrier.

In this fabricating method, the polishing of the rear surface of the semiconductor substrate is performed after the second chip separating groove 22 and the second chip separating groove plating layer 52 are formed. However, in the United States Patent, a method in which the second chip separating groove 22 and the second chip separating groove plating layer 52 are formed after the polishing of the rear surface of the semiconductor substrate is performed is also disclosed. In this case, the first chip separating groove 2 formed on the front surface of the semiconductor substrate is of such a depth that it does not penetrate to the rear surface of the semiconductor substrate as a result of the polishing of the rear surface of the semiconductor substrate.

In the fabricating method disclosed in the United States Patent, since the bottom surface of the first chip separating groove plating layer does not appear on the polishing surface when the rear surface of the semiconductor substrate is polished, the metallization layer or the plating layer inside the chip separating groove is not ruptured, nor does it protrude from the rear surface of the semiconductor substrate as in the fabricating method described first.

In the fabricating method of a semiconductor device disclosed in the United States Patent, the first chip separating groove plating layer has a thickness of 10 μm, which is thicker than that of the plating layer in the groove of the fabricating method described first, which is 5 μm. This is because a PHS layer is not formed in the region of the rear surface of the semiconductor substrate where the first and the second chip separating grooves are formed and, therefore, it is necessary to maintain the strength of the mechanical connection between semiconductor chips only with the plating layer inside the chip separating grooves. However, even in the method disclosed in this United States Patent, the occurrence of a crack in the semiconductor substrate due to the plating protrusion cannot be prevented.

Furthermore, in the fabricating method disclosed in the United States Patent, since the PHS layer is not formed in the region of the rear surface of the semiconductor substrate where the first and the second chip separating grooves are formed, the strength of the mechanical connection between semiconductor chips is weaker than that in a case where the PHS layer is formed on the entire rear surface of the semiconductor substrate including the chip separating groove region as in the fabricating method described first. Therefore, after the PHS layer is formed and the glass plate is removed, handling is difficult when the semiconductor chips are joined in the shape of the semiconductor substrate, and measurement of electrical characteristics of the semiconductor element at this stage also becomes difficult.

SUMMARY OF THE INVENTION

It is an object of the present invention to provide a fabricating method of a semiconductor device in which a occurrence of a crack in a semiconductor substrate due to a plating protrusion can be prevented and, during polishing the rear surface of the semiconductor substrate, a metallization layer inside a chip separating groove formed on the front surface side of the semiconductor substrate does not make contact with the polishing surface.

It is another object of the present invention to provide a method of fabricating a semiconductor device in which the mechanical strength of a connection between semiconductor chips after a PHS layer is formed is excellent.

It is yet another object of the present invention to provide a semiconductor device fabricated thereby.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor device comprises the steps of preparing a semiconductor substrate having a front surface and a rear surface, a plurality of semiconductor elements being formed on its front surface; forming a first chip separating groove which is to separate the semiconductor substrate into a plurality of semiconductor chips at a prescribed location of the semiconductor substrate, each semiconductor chip having one of the semiconductor elements, such that the depth of the first chip separating groove is less than a prescribed thickness of the semiconductor substrate obtained after polishing or thinning the rear surface of the semiconductor substrate; forming a first metallization layer on the internal surface of the first chip separating groove; polishing or thinning the rear surface of the semiconductor substrate such that its thickness becomes the prescribed thickness; separating the semiconductor substrate into a plurality of the semiconductor chips by etching a region of the rear surface of the semiconductor substrate opposite to the first chip separating groove until the bottom of the first metallization layer is exposed, thereby forming a second chip separating groove; forming a second metallization layer comprising metal harder than the metal constituting a PHS layer which is later produced, on the internal surface of the second chip separating groove; forming a PHS layer which is a metallization layer for heat dispersion on the entire surface of the rear surface side of the semiconductor substrate including the second chip separating groove; and forming a plurality of semiconductor devices, each comprising the semiconductor chip and the PHS layer disposed on the rear surface side of the semiconductor chip, by cutting the first metallization layer, the second metallization layer, and the PHS layer in the first chip separating groove. Therefore, since the PHS layer is formed on the entire rear surface of the semiconductor substrate, the strength of the mechanical joining between semiconductor chips from the step of forming this PHS layer to the step of cutting each metallization layer in the chip separating groove region becomes excellent. Furthermore, since the PHS layer is formed on the entire rear surface of the semiconductor substrate, and since the depth of the first chip separating groove is smaller than the thickness of the semiconductor substrate which is thinned by polishing or thinning the rear surface of the semiconductor substrate, that is, the semiconductor substrate of a certain thickness is left under the first chip separating groove during polishing or thinning the rear surface of the semiconductor substrate, it is not necessary to require the first metallization layer to have a mechanical joining strength. Therefore, it is possible to make the thickness of the first metallization as small as 1 $\mu$m or less, and this prevents a thick metal protrusion such as previously mentioned plating protrusion in the peripheral region of the front surface of the semiconductor substrate from being formed, thereby preventing a crack in the semiconductor substrate due to this protrusion when a glass plate is attached from occurring. Furthermore, since the semiconductor substrate of a certain thickness is left under the first chip separating groove during polishing or thinning the rear surface of the semiconductor substrate as described above, the first metallization layer is not exposed by this polishing or thinning of the rear surface of the semiconductor substrate. Therefore, a difficulty in a subsequent photolithography process because of the rupture of the first metallization layer or its protrusion toward the rear surface of the semiconductor substrate due to the polishing or thinning does not arise. As described above, by using this fabricating method, a stable fabrication of a semiconductor device having a good yield becomes possible. Furthermore, a recess having a depth almost equal to the depth of the second chip separating groove having the second metallization layer on its internal surface is produced in the chip separating groove region of the surface of the PHS layer opposite the semiconductor substrate side, and this recess reduces the amount of protrusion of the burrs occurring at the PHS layer (protrusion toward the rear surface side at a section of the PHS layer) from the rear surface of the PHS layer in the semiconductor chip region. Therefore, the adhesion between the PHS layer and a chip carrier during a step of mounting the semiconductor device obtained after the cutting step onto the chip carrier can be made better than the case, which was already described as the prior art, where the burrs of the PHS layer fully protrude toward the surface of the PHS layer opposite the semiconductor substrate side. That is, a semiconductor device of high reliability having a good heat dispersion characteristic can be obtained.

According to a second aspect of the present invention, in the method described as the first aspect of the present invention, the step of forming the PHS layer comprises the steps of forming a first PHS layer which is a metallization layer for heat dispersion in a region of the rear surface side of the semiconductor substrate except the second chip separating groove; and forming a second PHS layer which is a metallization layer for heat dispersion on the entire surface of the rear surface side of the semiconductor substrate including the first PHS layer. Therefore, since the PHS layer is formed on the entire rear surface of the semiconductor substrate, the strength of the mechanical joining between semiconductor chips increases. A metal protrusion in the peripheral region of the front surface of the semiconductor substrate is not produced, and this prevents a crack in the semiconductor substrate from occurring. The rupture of the first metallization layer or its protrusion toward the rear surface of the semiconductor substrate due to the polishing or the thinning of the rear surface of the semiconductor substrate does not occur, either. As described above, by using this fabricating method, a stable fabrication of a semiconductor device having a good yield becomes possible. Furthermore, since the first PHS layer is not formed in the second chip separating groove region, the surface of the second PHS layer opposite the semiconductor substrate side immediately after its formation has a recess in the chip separating groove region, whose depth is equal to the sum of the thickness of the first PHS layer and the depth of the second chip separating groove having the second metallization layer on its internal surface. Therefore, it becomes possible to contain the burrs of the second PHS layer produced when the metallization layers in the chip separating region are cut within the above mentioned recess. That is, in the semiconductor device comprising a semiconductor chip obtained after the cutting step and the PHS layer formed on the rear surface of the semiconductor chip, the burrs of the PHS layer do not protrude beyond the surface of the PHS layer opposite semiconductor substrate side directly under the semiconductor chip. Therefore, in a step of mounting this semiconductor device onto a chip carrier, the adhesion between the PHS layer and the chip carrier can be made excellent. Therefore, a semiconductor device of high reliability having a good heat dispersion characteristic can be obtained.

According to a third aspect of the present invention, a method of fabricating a semiconductor device comprises the steps of preparing a semiconductor substrate having a front surface and a rear surface, a plurality of semiconductor elements being formed on its front surface; forming a first chip separating groove which is to separate the semiconductor substrate into a plurality of semiconductor chips at the prescribed location of the semiconductor substrate, each semiconductor chip having one of the semiconductor elements, such that the depth of the first chip separating groove is less than a prescribed thickness of the semiconductor substrate obtained after polishing or thinning the rear surface of the semiconductor substrate; forming a first metallization layer on the internal surface of the first chip separating groove; polishing or thinning the rear surface of the semiconductor substrate such that its thickness becomes the prescribed thickness; separating the semiconductor substrate into a plurality of the semiconductor chips by etching a region of the rear surface of the semiconductor substrate opposite to the first chip separating groove until the bottom of the first metallization layer is exposed, thereby forming a second chip separating groove; forming a second metallization layer comprising metal harder than the metal constituting a PHS layer which is later produced, on the internal surface of the second chip separating groove; forming a hard metallization layer whose thickness is almost equal to that of the PHS layer and which comprises metal harder than the metal constituting the PHS layer, in a region of the rear surface side of the semiconductor substrate where the second chip separating groove is formed; forming a PHS layer which is a metallization layer for heat dispersion on the entire surface of the rear surface side of the semiconductor substrate; leveling the surface of the PHS layer opposite the semiconductor substrate side by polishing or thinning the surface of the PHS layer opposite the semiconductor substrate side until the surface of the hard metallization layer opposite the semiconductor substrate side is exposed; and forming a plurality of semiconductor devices, each comprising the semiconductor chip, the PHS layer disposed on the rear surface of the semiconductor chip, and the hard metallization layer disposed along and beyond a complete circumference of the lateral surface of the PHS layer, by cutting the first metallization layer, the second metallization layer, and the hard metallization layer in the first chip separating groove. Therefore, the hard metallization layer of almost the same thickness as that of the PHS layer is formed on the chip separating region of the rear surface of the semiconductor substrate, and the PHS layer is formed on the remaining region. Therefore, the strength of the mechanical joining between semiconductor chips from the step of forming this PHS layer to the step of cutting each metallization layer in the chip separating groove region becomes excellent. And, since the hard metallization layer or the PHS layer is formed on the entire rear surface of the semiconductor substrate, and since the depth of the first chip separating groove is smaller than the thickness of the semiconductor substrate which is thinned by polishing or thinning the rear surface of the semiconductor substrate, that is, the semiconductor substrate of a certain thickness is left under the first chip separating groove during polishing or thinning the rear surface of the semiconductor substrate, it is not necessary to require the first metallization layer to have a mechanical joining strength. Therefore, it is possible to make the first metallization as thin as 1 $\mu$m or less, and this prevents the formation of a thick metal protrusion such as previously described plating protrusion in the peripheral region of the front surface of the semiconductor substrate, thereby preventing a crack in the semiconductor substrate due to this protrusion when a glass plate is attached from occurring. Furthermore, since the semiconductor substrate of a certain thickness is left under the first chip separating groove during polishing or thinning the rear surface of the semiconductor substrate as described above, the first metallization is not exposed on the rear surface of the semiconductor substrate by this polishing or thinning. Therefore, a difficulty in a subsequent photolithography process because of the rupture of the first metallization layer or its protrusion toward the rear surface of the semiconductor substrate due to the polishing or thinning does not arise. As described above, by using this fabricating method, a stable fabrication of a semiconductor device having a good yield becomes possible. Furthermore, since the hard metallization layer is formed in the chip separating groove of the rear surface of the semiconductor substrate, during a step of cutting the metallization layer in this region, the burrs produced at the hard metallization layer are smaller than the burrs produced when the PHS layer is directly cut. This makes the adhesion between the PHS layer and a chip carrier better than in a case where the burrs of the PHS layer protrude toward the surface of the PHS layer opposite the semiconductor substrate side in a step of mounting the semiconductor device obtained after the cutting step onto the chip carrier. Therefore, a semiconductor device of high reliability having a good heat dispersion characteristic can be obtained.

According to a fourth aspect of the present invention, the method described as the third aspect of the present invention further comprises the step of forming a buffer metallization layer which is to ease the cutting of the hard metallization layer and comprises metal softer than the metal constituting the hard metallization layer, on the entire surface of the rear surface side of the semiconductor substrate, after the step of forming the second metallization layer, and before the step of forming the hard metallization layer. Therefore, since the hard metallization or the PHS layer is formed on the entire rear surface of the semiconductor substrate as described above, the strength of the mechanical joining between semiconductor chips increases. A metal protrusion in the peripheral region of the front surface of the semiconductor substrate is not formed, and this prevents a crack in the semiconductor substrate from occurring. The rupture of the first metallization layer or its protrusion toward the rear surface of the semiconductor substrate due to the polishing or the thinning of the rear surface of the semiconductor substrate does not occur, either. Furthermore, since the buffer metallization layer comprising a soft metal is formed, when the metallization layer in the chip separating groove region is cut, the cutting is eased even though the hard metallization layer which is as thick as the PHS layer exists in this region. As described above, by using this fabricating method, a stable fabrication of a semiconductor device having a good yield becomes possible. Furthermore, the hard metallization layer is formed in the chip separating groove region of the rear surface of the semiconductor substrate. Therefore, the burrs produced at the hard metallization layer when the metallization layer in the chip separating groove region is cut are smaller than the burrs produced when the PHS layer is directly cut, and in a subsequent step of mounting the semiconductor device obtained after the above cutting process onto a chip carrier, the adhesion between the PHS layer and the chip carrier can be made better than in a case where the burrs of the PHS layer protrude toward the surface of the PHS layer opposite the semiconductor substrate side. Therefore, a semiconductor device of high reliability having a good heat dispersion characteristic can be obtained.

According to a fifth aspect of the present invention, in the method described as the third aspect of the present invention, in the step of forming the second chip separating groove, a resist which is thicker than the hard metallization layer is formed on the rear surface of the semiconductor substrate except a region opposite to the first chip separating groove and, the resist being used as a mask, the semiconductor substrate is etched until the bottom of the first metallization layer is exposed; in the step of forming the second metallization layer, the second metallization layer is formed on the internal surface of the second chip separating groove by selective plating, using the resist as a mask; the method of fabricating the semiconductor device further comprising the step of forming a buffer metallization layer which is to ease the cutting of the hard metallization layer and comprises metal softer than the metal constituting the hard metallization layer, on the surface of the second metallization layer opposite the semiconductor substrate side, after the step of forming the second metallization layer, and before the step of forming the hard metallization layer; and in the step of forming the hard metallization layer, the hard metallization layer is formed on the surface of the second metallization layer opposite the semiconductor substrate side by selective plating, using the resist as a mask and, then, the resist is removed. Therefore, as described above, since the hard metallization or the PHS layer is formed on the entire rear surface of the semiconductor substrate, the strength of the mechanical joining between semiconductor chips increases. A metal protrusion in the peripheral region of the front surface of the semiconductor substrate is not formed, and this prevents a crack in the semiconductor substrate due to this protrusion from occurring. The rupture of the first metallization layer or its protrusion toward the rear surface of the semiconductor substrate due to the polishing or the thinning of the rear surface of the semiconductor substrate does not occur, either. Furthermore, since the buffer metallization comprising a soft metal is formed, when the metallization layer in the chip separating groove region is cut, the cutting is eased even though the hard metallization layer which is as thick as the PHS layer exists in this region. As described above, by using this fabricating method, a stable fabrication of a semiconductor device having a good yield becomes possible. Furthermore, the hard metallization layer is formed in the chip separating groove region of the rear surface of the semiconductor substrate. Therefore, the burrs produced at this hard metallization layer when the metallization layer in the chip separating groove region is cut are smaller than the burrs produced when the PHS layer is directly cut, and during a subsequent step of mounting the semiconductor device obtained after the above cutting step onto a chip carrier, the adhesion between the PHS layer and the chip carrier can be made better than in the case where the burrs of the PHS layer protrude toward the surface of the PHS layer opposite the semiconductor substrate side. Therefore, a semiconductor device of high reliability having a good heat dispersion characteristic can be obtained.

According to a sixth aspect of the present invention, in the method described as the third aspect of the present invention, the hard metallization layer comprises Au—Sn alloy. Therefore, as described above, since the mechanical strength of the joining between semiconductor chips is excellent and there is no formation of the protrusion of metal in the peripheral region of the front surface of the semiconductor substrate, a crack in the semiconductor substrate is prevented from occurring and the rupture of the first metallization layer or the protrusion of this metallization layer toward the rear surface of the semiconductor substrate due to the polishing or the thinning of the rear surface of the semiconductor substrate does not occur. Furthermore, the burrs produced at the section when the hard metallization layer is cut are melted by heating up to about 300° C. when the semiconductor device is mounted onto a chip carrier because the hard metallization comprises Au—Sn alloy, and this does not deteriorate the adhesion between the PHS layer and the chip carrier. Therefore, a semiconductor device of high reliability having a good heat dispersion characteristic can be obtained.

According to a seventh aspect of the present invention, in any of the methods described as the first and third aspects of the present invention, the first metallization layer comprises a Ti layer, a Pd layer, and an Au layer successively laminated; and in the step of forming the second metallization layer, the Pd layer is exposed by etching away the Ti layer which is the lower most layer of the first metallization layer exposed in the second chip separating groove and, then, the second metallization layer comprising Ni or Ni based alloy is formed by Ni based non-electrolytic plating, using the Pd layer as an activating layer. Therefore, as described above, since the mechanical strength of the joining between semiconductor chips is excellent and there is no formation of the protrusion of metal in the peripheral region of the front surface of the semiconductor substrate, a crack in the semiconductor substrate is prevented from occurring and the rupture of the first metallization or the protrusion of this metallization layer toward the rear surface of the semiconductor substrate due to the polishing or the thinning of the rear surface of the semiconductor substrate does not occur. Furthermore, the second metallization layer comprising Ni or Ni based alloy can easily be formed by Ni based non-electrolytic plating using the Pd layer as an activating layer. As described above, by using this fabricating method, a stable fabrication of a semiconductor device having a good yield becomes possible.

According to an eighth aspect of the present invention, a method of fabricating a semiconductor device comprises the steps of preparing a semiconductor substrate having a front surface and a rear surface, a plurality of semiconductor elements being formed on its front surface; forming a first chip separating groove which is to separate the semiconductor substrate into a plurality of semiconductor chips at a prescribed location of the semiconductor substrate, each semiconductor chip having one of the semiconductor elements, such that the depth of the first chip separating groove is less than a prescribed thickness of the semiconductor substrate obtained after polishing or thinning the rear surface of the semiconductor substrate; forming a first metallization layer on the internal surface of the first chip separating groove; polishing or thinning the rear surface of the semiconductor substrate such that its thickness becomes the prescribed thickness; forming a first electrical supply layer on the entire rear surface of the semiconductor substrate and, then, forming a first PHS layer which is a metallization layer for heat dispersion on the surface of the first electrical supply layer opposite the semiconductor substrate side except a region opposite to the first chip separating groove by electrolytic plating; separating the semiconductor substrate into a plurality of the semiconductor chips by etching the first electrical supply layer and the semiconductor substrate from the first electrical supply layer side, using the first PHS layer as a mask, until the bottom of the first metallization layer is exposed, thereby forming a second chip separating groove; forming a second electrical supply layer on the entire surface of the rear surface side of the semiconductor substrate including the first PHS layer and the second chip separating groove; forming a second PHS layer on the entire surface of the electrical supply layer opposite the semiconductor substrate side by electrolytic plating; and forming a plurality of semiconductor devices, each comprising the semiconductor chip and the first and second PHS layers disposed on the rear surface side of the semiconductor chip, by cutting the first metallization layer, the second electrical supply layer, and the second PHS layer in the first chip separating groove. Therefore, since the PHS layer is formed on the entire rear surface of the semiconductor substrate, the strength of the mechanical joining between semiconductor chips increases. A metal protrusion in the peripheral region of the front surface of the semiconductor substrate is not formed, and this prevents a crack in the semiconductor substrate due to this protrusion from occurring. The rupture of the first metallization layer or its protrusion toward the rear surface of the semiconductor substrate due to the polishing or the thinning of the rear surface of the semiconductor substrate does not occur, either. As described above, by using this fabricating method, a stable fabrication of a semiconductor device having a good yield becomes possible. Furthermore, since the first PHS layer is not formed in the second chip separating groove region, there is a recess on the surface of the PHS layer opposite the semiconductor substrate side immediately after its formation, whose depth is equal to the sum of the thickness of the first PHS layer and the depth of the second chip separating groove. Therefore, the burrs of the second PHS layer produced when the metallization layer in the chip separating groove region is cut can be contained within this recess. That is, in the semiconductor device comprising a semiconductor chip obtained after the cutting step and the PHS layer formed on the rear surface of the semiconductor chip, the burrs of the PHS layer do not protrude beyond the surface of the PHS layer opposite the semiconductor substrate side directly under the semiconductor chip. Therefore, in a subsequent step of mounting this semiconductor device onto a chip carrier, the adhesion between the PHS layer and the chip carrier can be made excellent. That is, a semiconductor device of high reliability having a good heat dispersion characteristic can be obtained.

According to a ninth aspect of the present invention, in the method described as the eighth aspect of the present invention, the first electrical supply layer comprises Ti and Au laminated successively; and in the step of etching the first electrical supply layer and the semiconductor substrate, the first electrical supply layer is removed by wet etching and, then, the semiconductor substrate is etched. Therefore, since the PHS layer is formed on the entire rear surface of the semiconductor substrate, the strength of the mechanical joining between semiconductor chips increases. A metal protrusion in the peripheral region of the front surface of the semiconductor substrate is not formed, and this prevents a crack in the semiconductor substrate due to this protrusion from occurring. The rupture of the first metallization layer or its protrusion toward the rear surface of the semiconductor substrate due to the polishing or the thinning of the rear surface of the semiconductor substrate does not occur, either. Furthermore, since the first electrical supply layer comprises the Ti and the Au laminated, the first electrical supply layer can easily be formed by vacuum evaporation or sputtering deposition. And, since it is the Ti layer which makes contact with the rear surface of the semiconductor substrate, the adhesion between this first electrical supply layer and the semiconductor substrate becomes excellent. And, since it is the Au layer which is exposed on the surface of the electrical supply layer opposite the semiconductor substrate side immediately after the formation of this electrical supply layer, the PHS layer can easily be formed by disposing Au on the exposed surface of the Au by electrolytic plating. As described above, a stable fabrication of a semiconductor device having a good yield becomes possible. Furthermore, since the first PHS layer is not formed in the second chip separating groove region, there is a recess in the chip separating region of the surface of the second PHS layer opposite the semiconductor substrate side immediately after the formation of the second PHS layer, which has the depth equal to the sum of the thickness of the first PHS layer and the depth of the second chip separating groove. Therefore, it is possible to contain the burrs of the second PHS layer produced when the metallization layer in the chip separating groove region is cut within this recess. That is, in the semiconductor device comprising a semiconductor chip obtained after the cutting process and the PHS layer formed on the rear surface of the semiconductor chip, the burrs of the PHS layer do not protrude beyond the surface of the PHS layer opposite the semiconductor substrate surface directly under the semiconductor chip. Therefore, during a subsequent step of mounting this semiconductor device onto a chip carrier, the adhesion between the PHS layer and the chip carrier can be made excellent. Therefore, a semiconductor device of high reliability having a good heat dispersion characteristic can be obtained.

According to a tenth aspect of the present invention, in the method described as the eighth aspect of the present invention, the second electrical supply layer comprises Ni or Ni—P and its thickness is 3–5 $\mu$m. Therefore, since the PHS layer is formed on the entire rear surface of the semiconductor substrate, the strength of the mechanical joining between semiconductor chips increases. A metal protrusion in the peripheral region of the front surface of the semiconductor substrate is not formed, and this prevents a crack in the semiconductor substrate due to this protrusion from occurring. The rupture of the first metallization layer or its protrusion toward the rear surface of the semiconductor substrate due to the polishing or the thinning of the rear surface of the semiconductor substrate does not occur, either. Furthermore, since the second electrical supply layer existing on the surface of the second PHS layer of the semiconductor substrate side comprises Ni or NI—P which is harder than Au or Cu usually constituting the PHS layer, during the step of cutting the metallization layer in the chip separating groove region, the burrs which are a portion of the PHS metal produced at a section of the PHS layer protruding toward the front surface side of the semiconductor substrate can be prevented. As described above, by using this fabricating method, a stable fabrication of a semiconductor device having a good yield becomes possible. Furthermore, since the first PHS layer is not formed in the second chip separating groove region, there is a recess in the chip separating region of the surface of the second PHS layer opposite the semiconductor substrate side immediately after the formation of the second PHS layer, which has the depth equal to the sum of the thickness of the first PHS layer and the depth of the second chip separating groove. Therefore, it is possible to contain the burrs of the second PHS layer produced when the metallization layer in the chip separating groove region is cut within this recess. That is, in the semiconductor device comprising a semiconductor chip obtained after the cutting process and the PHS layer formed on the rear surface of the semiconductor chip, the burrs of the PHS layer do not protrude from the surface of the PHS layer opposite the semiconductor substrate side directly under the semiconductor chip. Therefore, during a subsequent step of mounting this semiconductor device onto a chip carrier, the adhesion between the PHS layer and the chip carrier can be made excellent. Therefore, a semiconductor device of high reliability having a good heat dispersion characteristic can be obtained.

According to an eleventh aspect of the present invention, a method of fabricating a semiconductor device comprises the steps of preparing a semiconductor substrate having a front surface and a rear surface, a plurality of semiconductor elements being formed on its front surface; forming a first chip separating groove which is to separate the semiconductor substrate into a plurality of semiconductor chips at a prescribed location of the semiconductor substrate, each semiconductor chip having one of the semiconductor elements, such that the depth of the first chip separating groove is less than a prescribed thickness of the semiconductor substrate obtained after polishing or thinning the rear surface of the semiconductor substrate; forming a first metallization layer on the internal surface of the first chip separating groove; polishing or thinning the rear surface of the semiconductor substrate such that its thickness becomes the prescribed thickness; forming a first electrical supply layer on the entire rear surface of the semiconductor substrate and, then, forming a plating metallization layer by electrolytic plating on the surface of the first electrical supply layer opposite the semiconductor substrate side except a region opposite to the first chip separating groove; separating the semiconductor substrate into a plurality of the semiconductor chips by etching the first electrical supply layer and the semiconductor substrate from the first electrical supply layer side until the bottom of the first metallization layer is exposed, using the plating metallization layer as a mask, thereby forming a second chip separating groove; forming a second electrical supply layer on the entire surface of the rear surface side of the semiconductor substrate including the second chip separating groove and, then, forming a buffer metallization layer which is to ease the cutting of the second metallization layer and comprises metal softer than the metal constituting the second metallization layer, on the entire surface of the second electrical supply layer opposite the semiconductor substrate side; forming a second metallization layer comprising metal harder than the metal constituting a PHS layer which is later produced in the second chip separating groove region of the surface of the buffer metallization layer opposite the semiconductor substrate side; forming a first PHS layer which is a metallization layer for heat dispersion on the surface of the buffer metallization layer opposite the semiconductor substrate side except the second chip separating groove region; forming a second PHS layer which is a metallization layer for heat dispersion on the entire surfaces opposite the semiconductor substrate side of the second metallization layer and the first PHS layer; and forming a plurality of semiconductor devices, each comprising the semiconductor chip and the first and second PHS layers disposed on the rear surface side of the semiconductor chip by cutting the first metallization layer, the second electrical supply layer, the buffer metallization layer, and the second PHS layer in the first chip separating groove. Therefore, since the PHS layer is formed on the entire rear surface of the semiconductor substrate, the strength of the mechanical joining between semiconductor chips increases. A metal protrusion in the peripheral region of the front surface of the semiconductor substrate is not formed, and this prevents a crack in the semiconductor substrate due to this protrusion from occurring. The rupture of the first metallization layer or its protrusion toward the rear surface of the semiconductor substrate due to the polishing or the thinning of the rear surface of the semiconductor substrate does not occur, either. Furthermore, since the second metallization layer existing on the surface of the second PHS layer of the semiconductor substrate side comprises a metal which is harder than the metal constituting the PHS layer, during the step of cutting the metallization layer in the chip separating groove region, the burrs produced at a section of the PHS layer protruding toward the front surface side of the semiconductor substrate can be prevented. Furthermore, since the buffer metallization layer is formed, the cutting of the metallization layer in the chip separating groove region is easily performed. As described above, by using this fabricating method, a stable fabrication of a semiconductor device having a good yield becomes possible. Furthermore, since the first PHS layer is not formed in the second chip separating groove region, there is a recess in the chip separating region of the surface of the second PHS layer opposite the semiconductor substrate side immediately after the formation of the second PHS layer, which has the depth equal to the sum of the thickness of the first PHS layer and the depth of the second chip separating groove having the second metallization layer on its internal surface. Therefore, it is possible to contain the burrs of the second PHS layer produced when the metallization layer in the chip separating groove region is cut within this recess. That is, in the semiconductor device comprising a semiconductor chip obtained after the cutting process and the PHS layer formed on the rear surface of the semiconductor chip, the burrs of the PHS layer do not protrude beyond the surface of the PHS layer opposite the semiconductor substrate side directly under the semiconductor chip. Therefore, during a subsequent step of mounting this semiconductor device onto a chip carrier, the adhesion between the PHS layer and the chip carrier can be made excellent. Therefore, a semiconductor device of high reliability having a good heat dispersion characteristic can be obtained. In the above fabricating method of the semiconductor device described as the tenth aspect of the present invention, in order to prevent the burrs produced at a section of the second PHS layer protruding toward the front surface side of the semiconductor substrate, the second electrical supply layer comprising Ni or Ni—P which is harder than Au or Cu usually constituting the PHS layer becomes as thick as 3–5 $\mu$m. However, since the Ni or the Ni—P has smaller heat conductivity than the Au or the Cu, if the second electrical supply layer formed on the entire surface of the rear surface side of the semiconductor substrate becomes thick, heat conduction from the semiconductor chip to the PHS layer becomes deteriorated. On the other hand, in the fabricating method described as the eleventh aspect of the present invention, since the second metallization layer comprising a metal harder than the metal constituting the PHS layer is formed only in the second chip separating groove region, the burrs produced at the section of the PHS layer protruding toward the front surface side of the semiconductor substrate can be prevented from occurring without deteriorating the heat conduction from the semiconductor chip to the PHS layer.

According to a twelfth aspect of the present invention, a method of fabricating a semiconductor device comprises the steps of preparing a semiconductor substrate having a front surface and a rear surface, a plurality of semiconductor elements being formed on its front surface; forming a first chip separating groove which is to separate the semiconductor substrate into a plurality of semiconductor chips at a prescribed location of the semiconductor substrate, each semiconductor chip having one of the semiconductor elements, such that the depth of the first chip separating groove is less than a prescribed thickness of the semiconductor substrate obtained after polishing or thinning the rear surface of the semiconductor substrate; forming a first metallization layer on the internal surface of the first chip separating groove; polishing or thinning the rear surface of the semiconductor substrate such that its thickness becomes the prescribed thickness; forming an electrical supply layer on the entire rear surface of the semiconductor substrate and, then, forming a PHS layer which is a metallization layer for heat dispersion by electrolytic plating on the surface of the electrical supply layer opposite the semiconductor substrate side except a region opposite to the first chip separating groove; separating the semiconductor substrate into a plurality of semiconductor chips by etching the electrical supply layer and the semiconductor substrate from the electrical supply layer side, using the PHS layer as a mask, until the bottom of the first metallization layer is exposed, thereby forming a second chip separating groove; filling the second chip separating groove and a space between the PHS layers in the second chip separating groove region with a ceramic paste by applying and drying the ceramic paste on the entire surface of the rear surface side of the semiconductor substrate; leveling the ceramic paste by polishing or thinning the ceramic paste until the surface of the PHS layer opposite the semiconductor substrate side is exposed; forming a ceramic layer by curing the ceramic paste by heat treatment; and forming a plurality of semiconductor devices, each comprising the semiconductor chip, the PHS layer disposed on the rear surface of the semiconductor chip, and the ceramic layer disposed along and beyond a complete circumference of the lateral surface of the PHS layer by cutting the first metallization layer and the ceramic layer in the first chip separating groove. Therefore, since the ceramic layer of almost the same thickness as that of the PHS layer is formed in the chip separating groove region of the rear surface of the semiconductor chip and the PHS layer is formed in the remaining region, the strength of the mechanical joining between semiconductor chips from the step of forming the PHS layer to the step of cutting each metallization layer in the chip separating groove region becomes excellent. And, since the ceramic layer or the PHS layer is formed on the entire rear surface of the semiconductor substrate, and since the depth of the first chip separating groove is smaller than the thickness of the semiconductor substrate which is thinned by polishing or thinning the rear surface of the semiconductor substrate, that is, the semiconductor substrate of a certain thickness is left under the first chip separating groove during the polishing or the thinning of the rear surface of the semiconductor substrate, it is not necessary to require the first metallization layer to have a mechanical joining strength. Therefore, it is possible to make the first metallization layer as thin as 1 μm or less, and this prevents the formation of a thick metal protrusion such as previously mentioned plating protrusion in the peripheral region of the front surface of the semiconductor substrate surface. A crack in the semiconductor substrate due to this protrusion when a glass plate is attached is also prevented from occurring. Furthermore, as described above, since the semiconductor substrate of a certain thickness is left under the first chip separating groove during the polishing or the thinning of the rear surface of the semiconductor substrate, the first metallization layer is not exposed on the rear surface of the semiconductor substrate by this polishing or thinning. Therefore, a difficulty in a subsequent photolithography process because of the rupture of the first metallization layer or its protrusion toward the rear surface of the semiconductor substrate due to this polishing or thinning does not arise. As described above, by using this fabricating method, a stable fabrication of a semiconductor device having a good yield becomes possible. And, as described above, since the ceramic layer is formed in the chip separating groove region of the rear surface side of the semiconductor substrate, the burrs do not occur at this ceramic layer in the step of cutting the metallization layer and the ceramic layer in this region. Therefore, the adhesion between the PHS layer and a chip carrier can be made excellent in a subsequent step of mounting the semiconductor device obtained after the above cutting step onto the chip carrier. Therefore, a semiconductor device of high reliability having a good heat conduction characteristic can be obtained.

According to a thirteenth aspect of the present invention, a method of fabricating a semiconductor device comprises the steps of preparing an epitaxial layer structure having a front surface and a rear surface and comprising a semiconductor substrate, an etching stopper layer disposed on the semiconductor substrate, and an epitaxial layer disposed on the etching stopper layer, the surface of the epitaxial layer being the front surface, the surface of the semiconductor substrate opposite the etching stopper layer side being the rear surface, and a plurality of semiconductor elements being formed on the front surface; forming a chip separating groove which are to separate the epitaxial layer structure into a plurality of semiconductor chips at a prescribed location on the epitaxial layer structure, each semiconductor chip having a semiconductor element, by etching the epitaxial layer until the etching stopper layer is exposed; forming a metallization layer on the internal surface of the chip separating groove; removing the semiconductor substrate by etching which automatically stops when the etching stopper layer is exposed; removing the etching stopper layer and, then, exposing the metallization layer on the surface of the epitaxial layer on the rear surface side of the epitaxial layer structure; forming a PHS layer which is a metallization layer for heat dispersion on the entire rear surface of the epitaxial layer structure; and forming a plurality of semiconductor devices, each comprising the semiconductor chip and the PHS layer disposed on the rear surface side of the semiconductor chip by cutting the metallization layer and the PHS layer in the chip separating groove. Therefore, since the PHS layer is formed on the entire rear surface of the epitaxial layer, the strength of the mechanical joining between semiconductor chips from the step of forming this PHS layer to the step of cutting each metallization layer in the chip separating groove region becomes excellent. And, since the PHS layer is formed on the entire rear surface of this epitaxial layer and the removal of the semiconductor substrate is performed not by polishing or thinning but by etching, it is not necessary to require the metallization to have the mechanical joining strength. Therefore, it is possible to make the metallization layer as thin as 1 μm or less, and this prevents the formation of a thick metal protrusion such as previously mentioned plating protrusion in the peripheral region of the front surface of the semiconductor substrate. A crack in the semiconductor substrate due to this protrusion when a glass plate is attached is also prevented from occurring. Furthermore, as described above, since the chip separating groove is formed by etching which automatically stops when the surface of the etching stopper layer is exposed from the front surface side of the semiconductor substrate, and since the removal of the semiconductor substrate is performed by etching which automatically stops when the surface of the etching stopper layer of the semiconductor substrate side is exposed from the rear surface side of the semiconductor substrate, and furthermore since, following the removal of the semiconductor substrate, the bottom of the metallization layer is exposed on the rear surface of the semiconductor substrate for the first time by selectively etching away only the etching stopper layer, the metallization layer is not ruptured at this stage, nor does it protrude from the rear surface of the semiconductor substrate. Therefore, a difficulty in the subsequent step of photolithography does not arise. As described above, by using this fabricating method, a stable fabrication of a semiconductor device having a good yield becomes possible.

According to a fourteenth aspect of the present invention, in any of the methods described as the first, third, eighth, eleventh, and twelfth aspects of the present invention, the first metallization layer comprises a Ti layer and an Au layer laminated; and in the step of forming the second chip separating groove, the semiconductor substrate is etched and, then, the exposed Ti layer of the first metallization layer is etched away, thereby exposing the Au layer in the second chip separating groove. Therefore, since it is the Ti layer which makes contact with the semiconductor substrate, the tightness between the first metallization layer and the semiconductor substrate becomes excellent. And, since it is the Au layer which is formed on the Ti layer, the selective etching of only the Ti after the etching of the second chip separating groove can easily be performed. Furthermore, since it is the Au layer which is exposed in the second chip separating groove after the etching of this Ti layer, the formation of the second metallization layer on the surface of the Au layer opposite the semiconductor substrate side by plating can easily be performed. As described above, by using this fabricating method, a stable fabrication of a semiconductor device having a good yield becomes possible.

According to a fifteenth aspect of the present invention, in any of the methods described as the first, third, eighth, eleventh, twelfth, and thirteenth aspects of the present invention, the PHS layer, the first PHS layer, or the second PHS layer comprises Au or Cu. Therefore, since these metals have large heat conductivity, the heat conduction from a semiconductor chip to a chip carrier becomes excellent.

According to a sixteenth aspect of the present invention, in any of the methods described as the first, third, and eleventh aspects of the present invention, the second metallization layer or the hard metallization layer comprises Ni or Ni—P alloy. Therefore, the burrs protruding both toward the front surface side and the rear surface side of the semiconductor substrate during a cutting step of the metallization layer in the chip separating groove region are prevented from occurring, and the mechanical joining strength between semiconductor chips can be reinforced. And, since the surface of the layer comprising the Ni or Ni—P alloy can be replaced with Au by substitutional non-electrolytic plating, it becomes easy to dispose an Au layer later on this layer by plating, and the adhesion between these two layers becomes excellent. As described above, by using this fabricating method, a stable fabrication of a semiconductor device having a good yield becomes possible.

According to a seventeenth aspect of the present invention, in any of the methods described as the fourth, fifth, and eleventh aspects of the present invention, the plating metallization layer or the buffer metallization layer comprises Au or Cu. Therefore, in the step of cutting the metallization layer in the chip separating groove region, even though the hard metallization layer is formed in this region, the cutting can easily be performed. As described above, by using this fabricating method, a stable fabrication of a semiconductor device having a good yield becomes possible.

According to an eighteenth aspect of the present invention, a semiconductor device is fabricated by preparing a semiconductor substrate having a front surface and a rear surface, a plurality of semiconductor elements being formed on the front surface; forming a first chip separating groove on the front surface of the semiconductor substrate and, then forming a first metallization layer on the internal surface of the first chip separating groove; polishing or thinning the rear surface of the semiconductor substrate so that the semiconductor substrate becomes of a prescribed thickness; forming a second chip separating groove on the rear surface of the semiconductor substrate so that the bottom of the first metallization layer and a second metallization layer on the internal surface of the second chip separating groove and, then, forming a PHS layer which is a metallization layer for heat dispersion on the entire surface of the rear surface side of the semiconductor substrate; cutting the first metallization layer, the second metallization layer, and the PHS layer in the first chip separating groove; the semiconductor device comprising a semiconductor chip and the PHS layer which is formed on the rear surface side of the semiconductor chip and whose circumference extends beyond the lateral surface of the semiconductor chip; and the distance from a reference plane which is located away from and parallel to the semiconductor substrate on the PHS layer side to the surface of the circumference portion of the PHS layer being greater than the distance from the same reference plane to the surface of the central portion of the PHS layer by the amount of the depth of the second chip separating groove having the second metallization layer on its internal surface. Therefore, since the PHS layer is formed on the entire rear surface of the semiconductor substrate and the semiconductor substrate of a certain thickness is left under the first chip separating groove during the polishing or the thinning of the rear surface of the semiconductor substrate, it is not necessary to require the first metallization layer to have the mechanical joining strength. This makes it possible to make the first metallization layer as thin as 1 μm or less, and this prevents the formation of a thick metal protrusion such as the previously mentioned plating protrusion in the peripheral region of the front surface of the semiconductor substrate. A crack in the semiconductor substrate due to this protrusion when the glass plate is attached can also be prevented from occurring. And, in the chip separating groove region of the PHS layer, there is a recess having a depth almost equal to the depth of the second chip separating groove having the second metallization layer on its internal surface, and this recess reduces the degree of protrusion of the burrs produced at the PHS layer from the surface of the PHS layer opposite the semiconductor substrate side during the step of cutting the metallization layer in this region. Therefore, the adhesion between the PHS layer and a chip carrier in the subsequent step of mounting the semiconductor device obtained after the cutting step onto the chip carrier can be made better than in the case, which was already described as the prior art, where the burrs of the PHS layer fully protrude from the surface of the PHS layer opposite the semiconductor substrate side. Because of this, a semiconductor device of high reliability having a good heat dispersion characteristic can be obtained.

According to a nineteenth aspect of the present invention, in the semiconductor device described as the eighteenth aspect of the present invention, the PHS layer is formed by first forming a first PHS layer on the rear surface side of the semiconductor substrate except a region of the second chip separating groove and, then, forming a second PHS layer on the entire surface of the rear surface side of the semiconductor substrate including the first PHS layer; the semiconductor device comprises a semiconductor chip, the first PHS layer formed on the rear surface side of the semiconductor chip, and the second PHS layer which is formed both on the surface of the first PHS layer opposite the semiconductor substrate side and on the lateral surface side of the first PHS layer and whose circumference extends beyond the lateral surface of the semiconductor chip; and the distance from a reference plane which is located away from and parallel to the semiconductor substrate on the PHS layer side to the surface of the circumference portion of the second PHS layer is greater than the distance from the same reference plane to the surface of the central portion of the second PHS layer by the amount equal to the sum of the thickness of the first PHS layer and the depth of the second chip separating groove having the second metallization layer on its internal surface. Therefore, since the PHS layer is formed on the entire rear surface of the semiconductor substrate, the formation of a metal protrusion in the peripheral region of the front surface of the semiconductor substrate is prevented, and a crack in the semiconductor substrate due to this protrusion is also prevented from occurring. Furthermore, since the first PHS layer is not formed in the second chip separating groove region, there is a recess in the chip separating groove region of the surface of the second PHS layer opposite the semiconductor substrate side immediately after its formation, whose depth is equal to the sum of the thickness of the first PHS layer and the depth of the second chip separating groove having the second metallization layer on its internal surface. Therefore, it becomes possible to contain the burrs of the second PHS layer produced when the metallization layer in the chip separating groove region is cut within this recess. That is, in the semiconductor device comprising the semiconductor chip obtained after the cutting step and the PHS layer formed on the surface of the PHS layer opposite the semiconductor substrate side, the burrs of the PHS layer do not protrude from the surface of the PHS layer opposite the semiconductor substrate side directly under the semiconductor chip. Therefore, in the step of mounting the semiconductor device onto a chip carrier, the adhesion between the PHS layer and the chip carrier can be made excellent. Therefore, a semiconductor device of high reliability having a good heat dispersion characteristic can be obtained.

According to a twentieth aspect of the present invention, a semiconductor device is fabricated by preparing a semiconductor substrate having a front surface and a rear surface, a plurality of semiconductor elements being formed on the front surface; forming a first chip separating groove on the front surface of the semiconductor substrate and, then forming a first metallization layer on the internal surface of the first chip separating groove; polishing or thinning the rear surface of the semiconductor substrate so that the semiconductor substrate becomes of a prescribed thickness; forming a second chip separating groove on the rear surface of the semiconductor substrate so that the bottom of the first metallization layer is exposed and a second metallization layer on the internal surface of the second chip separating groove and, then, forming a hard metallization layer which comprises metal harder than the metal constituting a PHS layer which is later produced and whose thickness is almost equal to that of the PHS layer, on the rear surface side of the semiconductor substrate where the second chip separating groove is formed; forming a PHS layer which is a metallization layer for heat dispersion on the entire surface of the rear surface side of the semiconductor substrate and, then, leveling the surface of the PHS layer opposite the semiconductor substrate side by polishing or thinning the surface of the PHS layer opposite the semiconductor substrate side until the surface of the hard metallization layer opposite the semiconductor substrate side is exposed; cutting the first metallization layer, the second metallization layer, and the hard metallization layer in the first chip separating groove; the semiconductor device comprising a semiconductor chip, the PHS layer formed on the rear surface side of the semiconductor chip, and the hard metallization layer formed along and beyond a complete circumference of the lateral surface of the PHS layer. Therefore, since the hard metallization layer or the PHS layer is formed on the entire rear surface of the semiconductor substrate and, since the depth of the first chip separating groove is smaller than the thickness of the semiconductor substrate which is thinned by polishing or thinning the rear surface of the semiconductor substrate, that is, the semiconductor substrate of a certain thickness is left under the first chip separating groove during the polishing or the thinning of the rear surface of the semiconductor substrate, it is not necessary to require the first metallization layer to have the mechanical joining strength. This makes it possible to make the first metallization layer as thin as 1 µm or less, and this prevents the formation of a thick metal protrusion such as the previously mentioned plating protrusion in the peripheral region of the front surface of the semiconductor substrate. A crack in the semiconductor substrate due to this protrusion when the glass plate is attached can also be prevented from occurring. And, since the hard metallization layer is formed as above in the chip separating groove region of the rear surface side of the semiconductor substrate, the burrs produced at this hard metallization layer when the metallization layer in this region is cut are smaller than the burrs produced when the PHS layer is directly cut, and in the subsequent step of mounting this semiconductor device onto a chip carrier, the adhesion between the PHS layer and the chip carrier can be made better than in the case where the burrs of the PHS layer protrude beyond the surface of the PHS layer opposite the semiconductor substrate side. Therefore, a semiconductor device of high reliability having a good heat dispersion characteristic can be obtained.

According to a twenty-first aspect of the present invention, in the semiconductor device described as the twenty-first aspect of the present invention, the hard metallization layer comprises Au—Sn alloy. Therefore, since there is no formation of a metal protrusion in the peripheral region of the front surface of the semiconductor substrate, a crack in the semiconductor substrate can be prevented from occurring. Furthermore, since the hard metallization layer comprises the Au—Sn alloy, the burrs produced at the section when this hard metallization is cut are melted by heating up to about 300° C. when the semiconductor device is mounted onto a chip carrier, and it does not deteriorate the adhesion between the PHS layer and the chip carrier. Therefore, a semiconductor device of high reliability having a good heat dispersion characteristic can be obtained.

According to a twenty-second aspect of the present invention, a semiconductor device is fabricated by preparing a semiconductor substrate having a front surface and a rear surface, a plurality of semiconductor elements being formed on the front surface; forming a first chip separating groove on the front surface of the semiconductor substrate and, then forming a first metallization layer on the internal surface of the first chip separating groove; polishing or thinning the rear surface of the semiconductor substrate so that the semiconductor substrate becomes of a prescribed thickness; forming a first PHS layer which is a metallization layer for heat dispersion on the rear surface side of the semiconductor substrate except a region opposite to the first chip separating groove and, then, forming a second chip separating groove by etching the semiconductor substrate from the rear surface side until the bottom of the first metallization layer is exposed, using the first PHS layer as a mask; forming a second PHS layer on the entire surface of the rear surface side of the semiconductor substrate and, then, cutting the first metallization layer and the second PHS layer in the first chip separating groove; the semiconductor device comprising a semiconductor chip, the first PHS layer formed on the rear surface side of the semiconductor chip, and the second PHS layer which is formed both on the surface of the first PHS layer opposite the semiconductor substrate side and on the lateral surface of the first PHS layer and whose circumference extends beyond the lateral surface of the semiconductor chip; and the distance from a reference plane which is located away from and parallel to the semiconductor substrate on the PHS layer side to the surface of the circumference portion of the second PHS layer being greater than the distance from the same reference plane to the surface of the central portion of the second PHS layer by the amount equal to the sum of the thickness of the first PHS layer and the depth of the second chip separating groove. Therefore, since the PHS layer is formed on the entire rear surface of the semiconductor substrate, it is possible to make the first metallization layer as thin as 1 µm or less. The formation of a metal protrusion in the peripheral region of the front surface of the semiconductor substrate is prevented, and a crack in the semiconductor substrate due to this protrusion is also prevented from occurring. Furthermore, since the first PHS layer is not formed in the second chip separating groove region, there is a recess in the chip separating groove region of the surface of the second PHS layer opposite the semiconductor substrate side immediately after its formation, whose depth is equal to the sum of the thickness of the first PHS layer and the depth of the second chip separating groove. Therefore, it becomes possible to contain the burrs of the second PHS layer produced when the metallization layer in the chip separating groove region is cut within this recess. That is, in this semiconductor device, the burrs of the PHS layer do not protrude beyond the surface of the PHS layer opposite the semiconductor substrate side directly under the semiconductor chip. Therefore, in the step of mounting the semiconductor device onto a chip carrier, the adhesion between the PHS layer and the chip carrier can be made excellent, thereby obtaining a semiconductor device of high reliability having a good heat dispersion characteristic.

According to a twenty-third aspect of the present invention, a semiconductor device is fabricated by preparing a semiconductor substrate having a front surface and a rear surface, a plurality of semiconductor elements being formed on the front surface; forming a first chip separating groove on the front surface of the semiconductor substrate and, then forming a first metallization layer on the internal surface of the first chip separating groove; polishing or thinning the rear surface of the semiconductor substrate so that the semiconductor substrate becomes of a prescribed thickness; forming a plating metallization layer on the rear surface of the semiconductor substrate except a region opposite to the first chip separating groove and, then, forming a second chip separating groove by etching the semiconductor substrate until the bottom of the first metallization layer is exposed, using the plating metallization layer as a mask; forming a buffer metallization layer comprising metal softer than the metal constituting the second metallization layer, on the entire surface of the rear surface side of the semiconductor substrate and, then, forming a second metallization layer comprising metal harder than the metal constituting a PHS layer which is later produced, in the second chip separating groove region of the surface of the buffer metallization layer opposite the semiconductor substrate side; forming a first PHS layer on the surface of the buffer metallization layer opposite the semiconductor substrate side except the second chip separating groove region and, then, forming a second PHS layer on the entire surfaces opposite the semiconductor substrate side of the second metallization layer and the first PHS layer; cutting the first metallization layer, the buffer metallization layer, the second metallization layer, and the second PHS layer in the first chip separating groove; the semiconductor device comprising a semiconductor chip, the buffer metallization layer formed on the rear surface side of the semiconductor chip, the first PHS layer formed on the surface of the buffer metallization layer opposite the semiconductor substrate side, and the second PHS layer which is formed both on the surface of the first PHS layer opposite the semiconductor substrate side and on the lateral surface side of the first PHS layer and whose circumference extends beyond the lateral surface of the semiconductor chip; and the distance from a reference plane which is located away from and parallel to the semiconductor substrate on the PHS layer side to the surface of the circumference portion of the second PHS layer being greater than the distance from the same reference plane to the surface of the central portion of the second PHS layer by the amount equal to the sum of the thickness of the first PHS layer and the depth of the second chip separating groove having the second metallization layer on its internal surface. Therefore, since the PHS layer is formed on the entire rear surface of the semiconductor substrate, it is possible to make the first metallization layer as thin as 1 $\mu$m or less. The formation of a metal protrusion in the peripheral region of the front surface of the semiconductor substrate is prevented, and a crack in the semiconductor substrate due to this protrusion is also prevented from occurring. Furthermore, since the first PHS layer is not formed in the second chip separating groove region, there is a recess in the chip separating groove region of the surface of the second PHS layer opposite the semiconductor substrate side immediately after its formation, whose depth is equal to the sum of the thickness of the first PHS layer and the depth of the second chip separating groove having the second metallization layer on its internal surface. Therefore, it becomes possible to contain the burrs of the second PHS layer produced when the metallization layer in the chip separating groove region is cut within this recess. That is, in this semiconductor device, the burrs of the PHS layer do not protrude from the surface of the PHS layer opposite the semiconductor substrate side directly under the semiconductor chip. Therefore, in the step of mounting the semiconductor device onto a chip carrier, the adhesion between the PHS layer and the chip carrier can be made excellent, thereby obtaining a semiconductor device of high reliability having a good heat dispersion characteristic. Furthermore, since the second metallization layer existing on the semiconductor substrate surface side of the second PHS layer comprises a metal harder than the metal constituting the PHS layer, the burrs produced at a section of the PHS layer protruding toward the front surface side of the semiconductor substrate when the metallization layer in the chip separating groove region is cut can be prevented.

According to a twenty-fourth aspect of the present invention, a semiconductor device is fabricated by preparing a semiconductor substrate having a front surface and a rear surface, a plurality of semiconductor elements being formed on its front surface; forming a first chip separating groove on the front surface of the semiconductor substrate and, then forming a first metallization layer on the internal surface of the first chip separating groove; polishing or thinning the rear surface of the semiconductor substrate so that the semiconductor substrate becomes of a prescribed thickness; forming a PHS layer which is a metallization layer for heat dispersion on the rear surface side of the semiconductor substrate except a region opposite to the first chip separating groove and, then, forming a second chip separating groove by etching the semiconductor substrate from the rear surface side until the bottom of the first metallization layer is exposed, using the PHS layer as a mask; filling the second chip separating groove and a space in the second chip separating groove region between the PHS layers with ceramic paste and, then, forming a ceramic layer by curing the ceramic paste by heat treatment; cutting the first metallization layer and the ceramic layer in the first chip separating groove; and the semiconductor device comprising a semiconductor chip, the PHS layer formed on the rear surface side of the semiconductor chip, and the ceramic layer formed along and beyond a complete circumference of the lateral surface of the PHS layer. Therefore, since the ceramic layer of almost the same thickness as that of the PHS layer is formed in the chip separating groove region of the rear surface of the semiconductor chip and the PHS layer is formed in the remaining region, it is not necessary to require the first metallization layer to have the mechanical joining strength. Therefore, it becomes possible to make the first metallization layer as thin as 1 $\mu$m or less, and this prevents the formation of a thick metal protrusion such as the previously mentioned plating protrusion in the peripheral region of the front surface of the semiconductor substrate. A crack in the semiconductor substrate due to this protrusion when the glass plate is attached can also be prevented from occurring. And, since the ceramic layer is formed as above in the chip separating groove region on the rear surface side of the semiconductor substrate, burrs are not produced at this ceramic layer in the step of cutting the metallization layer and the ceramic layer in this region. Therefore, in the subsequent step of mounting the semiconductor device obtained after the cutting step onto a chip carrier, the adhesion between the PHS layer and the chip carrier can be made excellent. Therefore, a semiconductor device of high reliability having a good heat dispersion characteristic can be obtained.

According to a twenty-fifth aspect of the present invention, a semiconductor device is fabricated by preparing an epitaxial layer structure having a front surface and a rear surface and comprising a semiconductor substrate, an etching stopper layer disposed on the semiconductor substrate, and an epitaxial layer disposed on the etching stopper layer, the surface of the epitaxial layer being the front surface, the surface of the semiconductor substrate opposite the etching stopper layer side being the rear surface, and a plurality of semiconductor elements being formed on the front surface; forming a chip separating groove on the front surface of the epitaxial layer structure by etching which automatically stops when an etching stopper layer is exposed and, then forming a metallization layer on the internal surface of the chip separating groove; removing the semiconductor substrate by etching which automatically stops when the etching stopper layer is exposed; removing the etching stopper layer, thereby exposing the bottom of the metallization layer on the surface of the epitaxial layer on the rear surface side of the epitaxial layer structure; forming a PHS layer which is a metallization layer for heat dispersion on the entire rear surface of the epitaxial layer and, then, cutting the metallization layer and the PHS layer in the chip separating groove; and the semiconductor device comprising a semiconductor chip and the PHS layer which is formed on the rear surface side of the semiconductor chip and whose circumference extends beyond the lateral surface of the semiconductor chip. Therefore, since the PHS layer is formed on the entire rear surface of the semiconductor substrate and the thinning of the semiconductor substrate is performed not by the polishing or the thinning but by the etching, it is not necessary to require the metallization layer to have the mechanical joining strength. Therefore, it is possible to make the metallization as thin as 1 $\mu$m or less, and this prevents the formation of a thick metal protrusion such as the previously mentioned plating protrusion in the peripheral region of the front surface of the semiconductor substrate surface. A crack in the semiconductor substrate due to this protrusion when the glass plate is attached can also be prevented.

BRIEF DESCRIPTION OF THE DRAWINGS

FIGS. 3(a)–3(e) are cross-sectional views illustrating a method of fabricating a semiconductor device according to a second embodiment of the present invention.

DETAILED DESCRIPTION OF THE PREFERRED EMBODIMENTS

[Embodiment 1]

A first embodiment of the present invention will be described.

Figure 1:
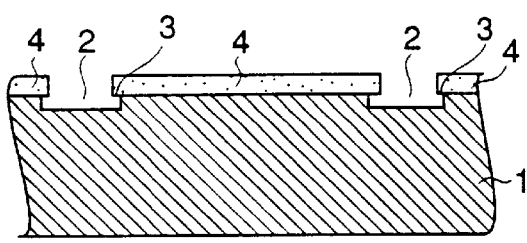
FIGS. 1(a)–1(g) are cross-sectional views illustrating a method of fabricating a semiconductor device according to a first embodiment of the present invention.
Figure 1:
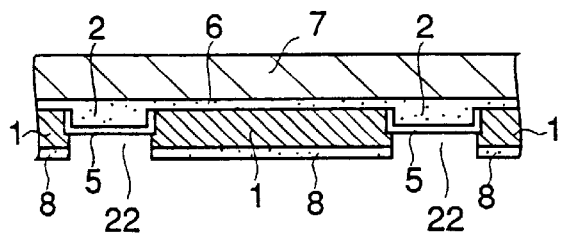
Figure 1:
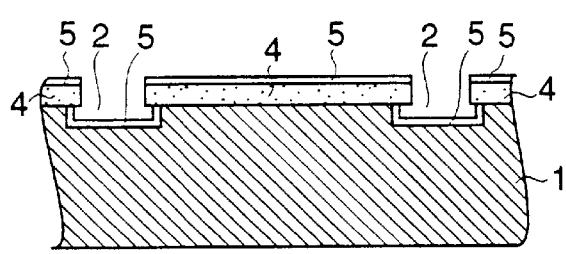
Figure 1:
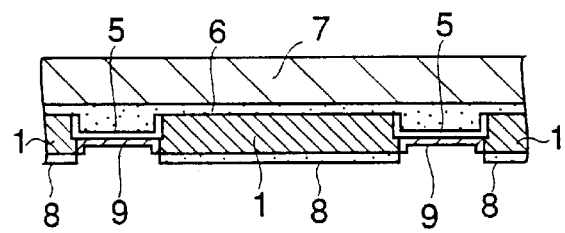
Figure 1:
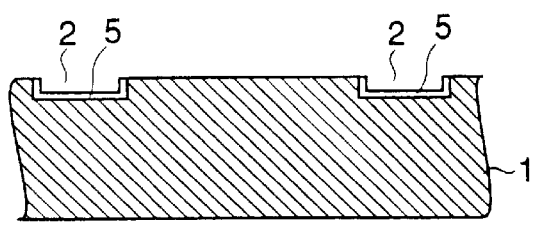
Figure 1:
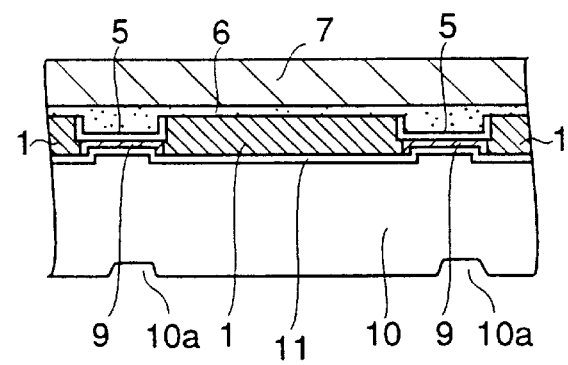
Figure 1:
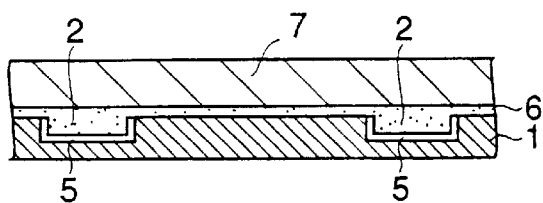
Figure 2:
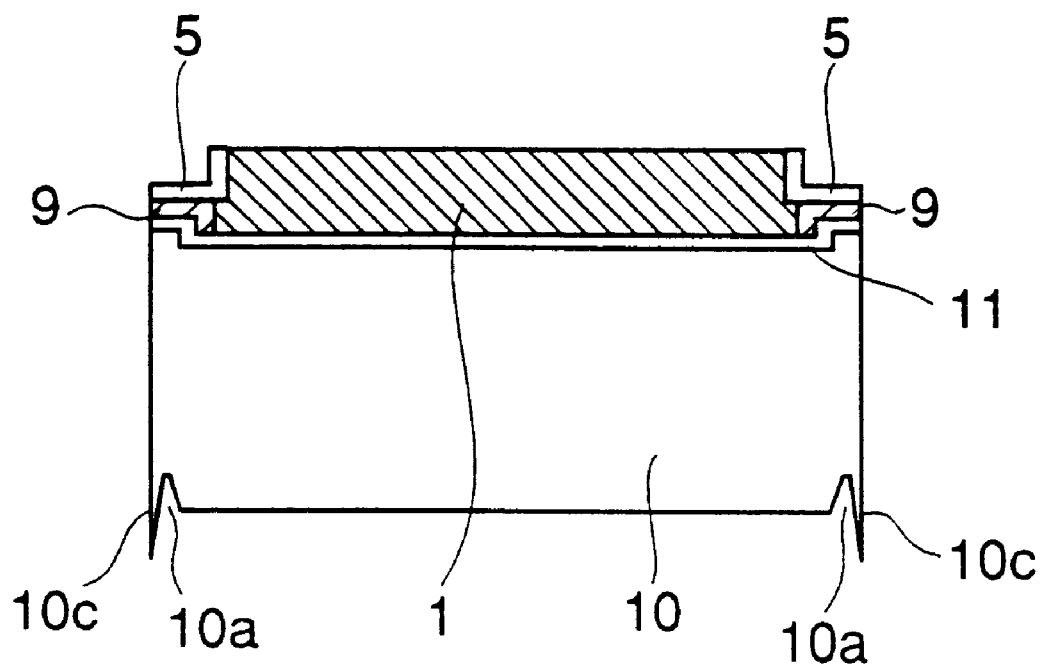
FIG. 2 is a cross-sectional view illustrating the semiconductor device according to the first embodiment of the present invention.

FIGS. 1(a)–1(g) are cross-sectional views illustrating a method of fabricating a semiconductor device in the processing order according to the first embodiment. First, after the photoresist 4 is formed on a region of the front surface of the semiconductor substrate 1 on which semiconductor elements are formed except for the chip separating groove region, the semiconductor substrate 1 is etched and the first chip separating groove 2 is formed, using the photoresist 4 as a mask. The depth of the first chip separating groove 2 is made to be about one-half the thickness of the semiconductor substrate 1 (for example, 30 μm) obtained in a step of polishing or thinning the rear surface of the substrate. In this etching process, anisotropic etching such as reactive ion etching or the like is first performed, and then by adding isotropic wet etching, the under cut 3 under the edge of the photoresist mask is formed (FIG. 1(a)). Next, a Ti layer and an Au layer are successively deposited on the entire front surface of the wafer by vacuum evaporation or sputtering deposition (FIG. 1(b)). The film thickness of the laminated film 5 comprising these two layers is 250–500 nm. The Ti layer has a thickness of about 50 nm and is for achieving excellent adhesion with the semiconductor substrate. Then by removing the photoresist 4, the first metallization layer 5 comprising the Ti/Au laminated film is left only inside the first chip separating groove 2 (FIG. 1(c)). This is easily accomplished because of the under-cut 3 under the photoresist mask. Next, the glass plate 7 is adhered to the semiconductor substrate surface using the wax 6 for adhesion, and then by polishing or thinning the rear surface of the semiconductor substrate (grinding, lapping, and the like), the semiconductor substrate 1 is thinned to a thickness of 25–30 μm (FIG. 1(d)). Next, the photoresist 8 is formed on a region of the rear surface of the semiconductor substrate except opposite to the first chip separating groove 2, and by etching the rear surface of the semiconductor substrate 1 until the bottom of the first metallization layer 5 is exposed, using the photoresist 8 as a mask, the second chip separating groove 22 is formed, thereby separating the semiconductor substrate 1 into the semiconductor chips (FIG. 1(e)). Next, only the Ti layer, which is the lowermost layer of the first metallization layer 5 exposed in the second chip separating groove 22, is selectively etched using a sulfuric acid/hydrogen peroxide based etchant so that the Au layer is exposed. Furthermore, the second metallization layer 9 is formed in the second chip separating groove 22 by Ni based non-electrolytic plating (FIG. 1(f)). Ni is a metal harder than Au and this second metallization layer 9 reinforces the first metallization layer 5. Then, a super thin layer (on the order of several tens of nm) at the surface of the second metallization layer 9 opposite the semiconductor substrate side comprising Ni is replaced with Au by substitutional non-electrolytic plating. This is to improve the adhesion with an electrical supply layer to be formed next on the surface of the second metallization layer 9 opposite the semiconductor substrate side. Then the photoresist 8 is removed, and Ti and Au are successively disposed on the entire rear surface of the semiconductor substrate including the second chip separating groove region by vacuum evaporation, sputtering deposition or non-electrolytic plating to form the electrical supply layer 11 having a thickness of about 500 nm. Next, the PHS layer 10 of 40–50 μm thick comprising Au or Cu is formed on the entire surface of the electrical supply layer 11 opposite the semiconductor substrate side by electrolytic plating (FIG. 1(g)). When the PHS layer 11 is formed, a recess 10a corresponding to the second chip separating groove having the second metallization layer 9 on its internal surface results at the chip separating groove region on the surface of the PHS layer opposite the semiconductor substrate side. Finally, the semiconductor substrate 1 is removed from the glass plate 7 and washed and, then, the surface of the PHS layer 10 opposite the semiconductor substrate side is adhered to an expand film and the metallization layer of the chip separating groove region is cut with a dicing blade from the front surface side of the semiconductor substrate, thereby obtaining a semiconductor device comprising the semiconductor chip 1 having a semiconductor element on the surface and the PHS layer 10 formed on the rear surface of the semiconductor chip as shown in FIG. 2. In FIG. 2, reference numeral 1 designates the semiconductor chip obtained by separating the semiconductor substrate, and reference numeral 10c designates burrs of the PHS layer resulted from the cutting of the metallization layer in the chip separating groove region. Since there is the recess 10a on the surface of the PHS layer, the protrusion length of the burr 10c from the PHS layer surface is reduced by the amount of the depth of this recess, that is, the depth of the second chip separating groove.

According to the first embodiment, since the PHS layer 10 covers the entire rear surface of the semiconductor substrate 1, the strength of the mechanical connection between semiconductor chips from the step of forming the PHS layer to the step of cutting the each metallization layer of the chip separating groove region is excellent. Furthermore, since the PHS layer 10 covers the entire rear surface of the semiconductor substrate, and since the depth of the first chip separating groove 2 is smaller than about one-half the thickness of the semiconductor substrate (30 μm) which is thinned by polishing or thinning of the rear surface of the semiconductor substrate, that is, a semiconductor substrate of a certain thickness remains under the first chip separating groove 2 immediately after the polishing or the thinning of the rear surface of the semiconductor substrate, it is not necessary to require the first metallization layer 5 to have mechanical joining strength. Therefore, it is possible to reduce the thickness of the first metallization layer 5 to 250–500 nm, which eliminates a thick protrusion of metal (5 μm) like the previously mentioned plating protrusion in the peripheral region of the front surface of the semiconductor substrate and prevents a crack in the semiconductor substrate due to this protrusion when the glass plate is attached. Furthermore, since there remains the semiconductor substrate of a certain thickness (about 15 μm) under the first chip separating groove 2 immediately after the polishing or the thinning of the rear surface of the semiconductor substrate, the first metallization layer 5 is not exposed on the rear surface of the semiconductor substrate by the polishing or thinning processes. Therefore, the first metallization layer 5 is not ruptured by the polishing or thinning processes. The difficulty in a subsequent photolithography process due to the protrusion of the first metallization layer 5 from the rear surface of the semiconductor substrate does not arise, either. As described above, by using this fabricating method, stable fabricating processes having a good yield can be obtained. Furthermore, there is the recess which is as deep as the second chip separating groove 22 having the second metallization layer 9 on its internal surface at the chip separating groove region on the surface of the PHS layer, and this reduces the length of the portion of the burr 10a produced at the PHS layer 10 during a step of cutting the metallization layer in this region which protrudes from the surface of the PHS layer directly under the semiconductor chip. Therefore, the adhesion between the PHS layer and a chip carrier, in a subsequent step of mounting the semiconductor device obtained, after the cutting process, onto the chip carrier is easier than in the case previously described as prior art in which the burrs of the PHS layer fully protrude from the surface of the PHS layer opposite the semiconductor substrate side. Because of this, a semiconductor device of high reliability having a good heat dispersion characteristic can be obtained.

[Embodiment 2]

A second embodiment of the present invention will be described.

Figure 4:
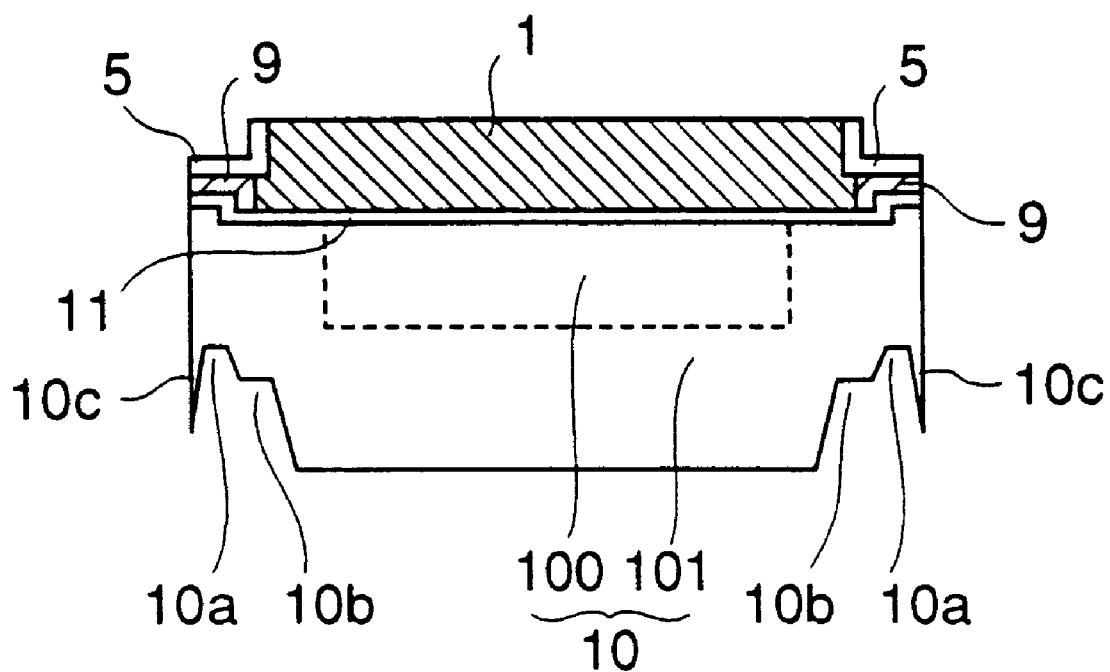
FIG. 4 is a cross-sectional view illustrating a semiconductor device according to the second embodiment of the present invention.

FIGS. 3(a)–3(e) are cross-sectional views illustrating a method of fabricating a semiconductor device in the processing order according to the second embodiment. First, the steps illustrated in FIGS. 1(a)–1(f) for the first embodiment are performed. FIG. 3(a), like FIG. 1(f), is a cross-sectional view immediately after the second metallization layer 9 is formed. Furthermore, as in the first embodiment, the surface of the second metallization layer opposite the semiconductor substrate side comprising Ni is replaced with Au, and after the photoresist 8 is removed, the electrical supply layer 11 comprising a Ti/Au laminated layer film is formed on the entire rear surface of the semiconductor substrate. Next, the photoresist 88 of a thickness of about 40 $\mu$m is formed on the region of the surface of the electrical supply layer 11 covering the chip separating groove region with an extra bit over the edge of the groove. Using this photoresist 88 as a mask, electrolytic plating is performed and the first PHS layer 100 of a thickness of 20–30 $\mu$m comprising Au or Cu is formed (FIG. 3(b)). The photoresist 88 is then removed (FIG. 3(c)), and the second PHS layer 101 of a thickness of about 30 $\mu$m comprising Au or Cu is formed on the entire rear surface of the semiconductor substrate by electrolytic plating (FIG. 3(d)), thereby obtaining the PHS layer 10 comprising the first PHS layer 100 and the second PHS layer 101. On the surface of the second PHS layer 101 opposite the semiconductor substrate side, the first recess 10a corresponding to the second chip separating groove 22 and the second recess 10b corresponding to the region where the first PHS layer 100 is not present are produced. The height of the step which the second recess 10b makes with the region of the second PHS layer surface where the recess is not present (region almost directly under the semiconductor chip) is 20 to 30 $\mu$m, which is almost the same as the thickness of the first PHS layer 100. And, the first recess 10a further has a step of about 10 $\mu$m with the second recess 10b, which is almost the same depth of the second chip separating groove having the second metallization layer 9 on its internal surface. Therefore, the height of a step which the first recess 10a makes with the region of the surface of the second PHS layer opposite the semiconductor substrate side where the recess is not present is 35–45 $\mu$m. That is, this step is bigger than the step of the recess of the PHS layer in the first embodiment by the amount of the thickness of the first PHS layer. Next, as in the first embodiment, the glass plate 7 is removed from the semiconductor substrate 1 which is washed, and then the surface of the PHS layer opposite the semiconductor substrate side is adhered to an expand tape and the metallization layer in the chip separating groove region is cut with a dicing blade from the front surface side of the semiconductor substrate (FIG. 3(e)). Reference numeral 10c in the figure designates the burr produced at a section of the PHS layer. The semiconductor device illustrated in FIG. 4 comprising the semiconductor chip 1 including a semiconductor element on the surface and the PHS layer 10 formed on the rear surface of this semiconductor chip is obtained.

According to the second embodiment, since the second PHS layer 101 covers the entire rear surface of the semiconductor substrate, the strength of the mechanical joining connection between semiconductor chips increases. And, since the thickness of the first metallization layer 5 can be reduced (250–500 nm), the metal protrusion in the peripheral region of the front surface of the semiconductor substrate is not formed and a crack in the semiconductor substrate can be prevented from occurring. Furthermore, the rupture of the first metallization 5 or its protrusion from the rear surface of the semiconductor substrate, which are due to the polishing or the thinning of the rear surface of the semiconductor substrate, do not occur. As described above, by using this fabricating method, stable fabricating processes having a good yield can be obtained. Furthermore, since the first PHS layer 100 is not present on the second chip separating groove 22 region, on the surface of the second PHS layer 101 immediately after its formation, there is a recess having a depth equal to the sum of the thickness of the first PHS layer 100 and the depth of the second chip separating groove 22 having the second metallization layer 9 on its internal surface (30–40 $\mu$m). This is deeper than the depth of the recess on the surface of the PHS layer in the first embodiment by the amount of the thickness of the first PHS layer 100. Therefore, the burr 10c of the second PHS layer 101 produced when the metallization layer of the chip separating groove region is cut can fully be contained within the recess. That is, in the semiconductor device comprising the semiconductor chip obtained after the above cutting process and the PHS layer formed on the rear surface of the semiconductor chip, the burr of the PHS layer does not protrude from the surface of the PHS layer opposite the semiconductor substrate side directly under the semiconductor chip. Therefore, in a subsequent step of mounting the semiconductor device onto a chip carrier, the adhesion between the PHS layer and the chip carrier can be made excellent, and a semiconductor device of high reliability having a good heat dispersion characteristic can be obtained.

[Embodiment 3]

A third embodiment of the present invention will be described.

Figure 5:
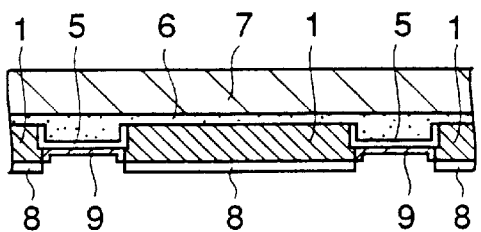
FIGS. 5(a)–5(g) are cross-sectional views illustrating methods of fabricating a semiconductor device according to third, fourth, and fifth embodiments of the present invention.
Figure 5:
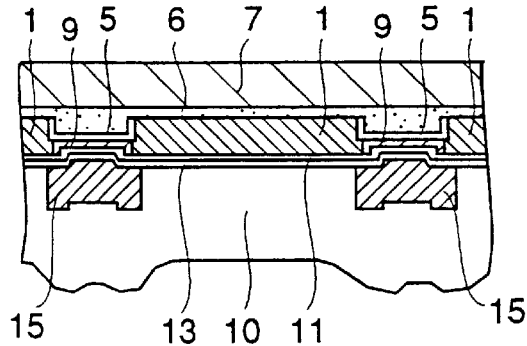
Figure 5:
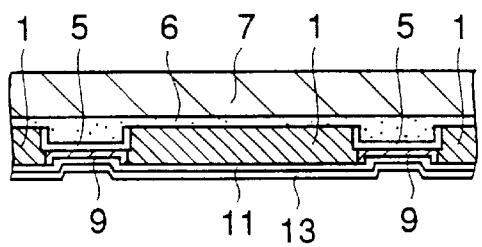
Figure 5:
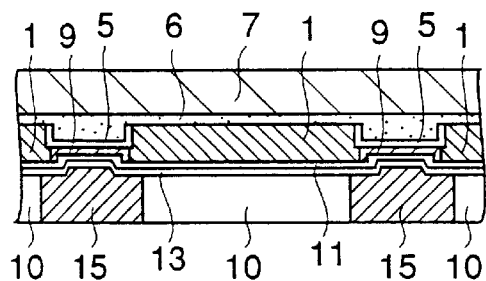
Figure 5:
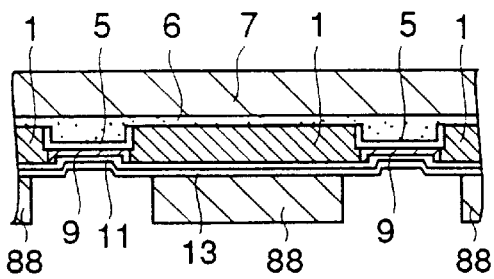
Figure 5:
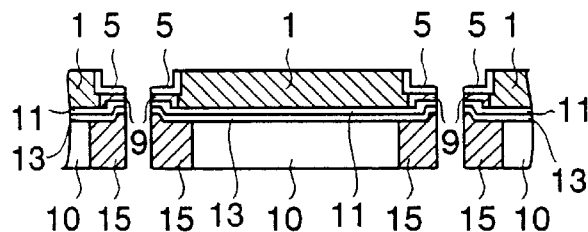
Figure 5:
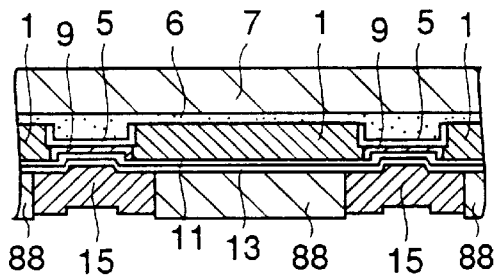
Figure 7:
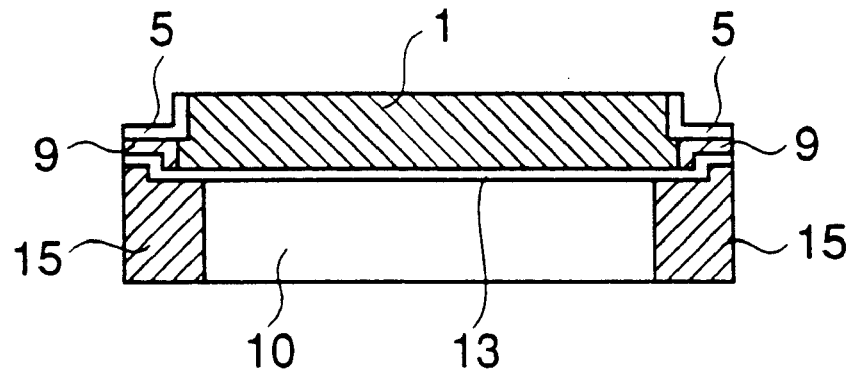
FIG. 7 is a cross-sectional view illustrating a semiconductor device according to the third, fourth, and fifth embodiments of the present invention.

FIGS. 5(a)–5(g) are cross-sectional views illustrating a method of a fabricating semiconductor device in the processing order according to the third embodiment. First, the steps illustrated in FIGS. 1(a)–1(f) for the first embodiment are performed. FIG. 5(a), like FIG. 1(f), is a cross-sectional view immediately after the second metallization layer 9 is formed. Furthermore, as in the first embodiment, the surface of the second metallization layer comprising Ni opposite the semiconductor substrate side is replaced with Au, and after the photoresist 8 is removed, the electrical supply layer 11 of a thickness of about 0.5 $\mu$m comprising a Ti/Au laminated layer film is formed on the entire rear surface of the semiconductor substrate. Next, the buffer metallization layer 13 of a thickness of about 5 $\mu$m comprising Au or Cu is formed on the entire surface of the electrical supply layer 11 opposite the semiconductor substrate side by electrolytic plating (FIG. 5(b)). Then, the photoresist 88 is formed on the surface of the buffer metallization layer 13 opposite the semiconductor substrate side except the chip separating groove region (FIG. 5(c)), and using this photoresist 88 as a mask, the hard metallization layer 15 comprising Ni is formed by electrolytic plating or non-electrolytic plating (FIG. 5(d)). Next, after the photoresist 88 is removed, the PHS layer 10 of a thickness 40–50 $\mu$m comprising Au is formed on the entire rear surface of the semiconductor substrate by electrolytic plating (FIG. 5(e)). Furthermore, the surface of the PHS layer 10 opposite the semiconductor substrate side is smoothed by mechanical processing or electric discharge processing or the like so that the hard metallization layer 15 is exposed (FIG. 5(f)). Finally, the glass plating 7 is removed from the semiconductor substrate 1 which is washed, and the surface of the PHS layer opposite the semiconductor substrate side is adhered to an expand tape and the metallization layer in the chip separating groove region is cut from the front surface side of the semiconductor substrate with a dicing blade (FIG. 5(g)), thereby obtaining a semiconductor device comprising the semiconductor chip 1 having a semiconductor element on its front surface, the PHS layer 10 formed on the rear surface of the semiconductor chip, and the hard metallization layer 15 formed along and beyond a complete circumference of the lateral surface of the PHS layer as shown in FIG. 7. The electrical supply layer 11 is omitted in FIG. 7.

According to the third embodiment, the hard metallization 15 having almost the same thickness as the PHS layer 10 is present at the chip separating groove region on the rear surface of the semiconductor substrate and the PHS layer is present in the remaining region. Therefore, the strength of the mechanical connection between semiconductor chips from the step of forming of the PHS layer to the step of cutting each metallization layer in the chip separating groove region is excellent. Furthermore, since the hard metallization layer 15 or the PHS layer 10 cover the entire rear surface of the semiconductor substrate, and since the depth of the first chip separating groove 2 (about 15 $\mu$m) is smaller than the thickness of the semiconductor substrate which is thinned by polishing or thinning of the rear surface of the semiconductor substrate (about 30 $\mu$m), that is, the semiconductor substrate in a certain thickness (about 15 $\mu$m) remains immediately after the polishing or the thinning of the rear surface of the semiconductor substrate, it is not necessary to require the first metallization layer 5 to have mechanical joining strength. Therefore, the first metallization layer can be made as thin as 250–500 nm and a thick metal protrusion such as the plating protrusion previously mentioned is not formed in the peripheral region of the front surface of the semiconductor substrate, which prevents a crack in the semiconductor substrate due to this protrusion from occurring when the glass plate 7 is attached. Furthermore, since the semiconductor substrate in a certain thickness remains under the first chip separating groove 2 immediately after the polishing or the thinning of the rear surface of the semiconductor substrate, the first metallization layer 5 is not exposed by this polishing or thinning processes. Therefore, difficulty in a subsequent photolithography process because of the rupture of the first metallization layer 5 or its protrusion from the rear surface of the semiconductor substrate due to the polishing or thinning processes does not arise. As described above, by using this fabricating method, stable fabricating processes having a good yield are obtained. Furthermore, since the hard metallization layer 15 is formed in the chip separating groove region on the rear surface of the semiconductor substrate, the burr comprising Ni produced at the hard metallization layer 15 in a step of cutting the metallization layer in the chip separating groove region is considerably smaller than those produced when the PHS layer comprising Au or Cu is directly cut as in the first and the second embodiments because Ni is harder than Au and Cu. Therefore, in a subsequent step of mounting the semiconductor device, after the cutting process, onto a chip carrier, the adhesion between the PHS layer and the chip carrier better than in a case where the burrs of the PHS layer protrude from the surface of the PHS layer opposite the semiconductor substrate side, thereby producing a semiconductor device of high reliability having a good heat dispersion characteristic.

[Embodiment 4]

A fourth embodiment of the present invention will be described.

Figure 6:
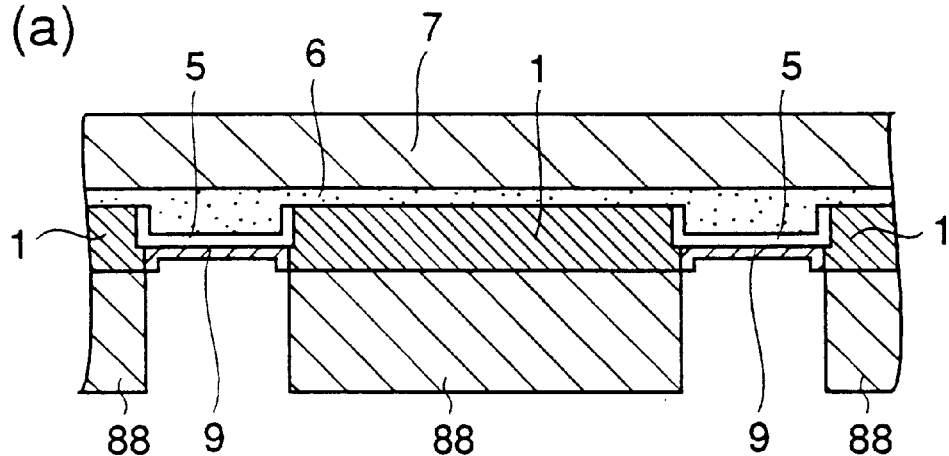
FIGS. 6(a)–6(c) are cross-sectional views illustrating methods of fabricating a semiconductor device according to the fourth and fifth embodiments of the present invention.
Figure 6:
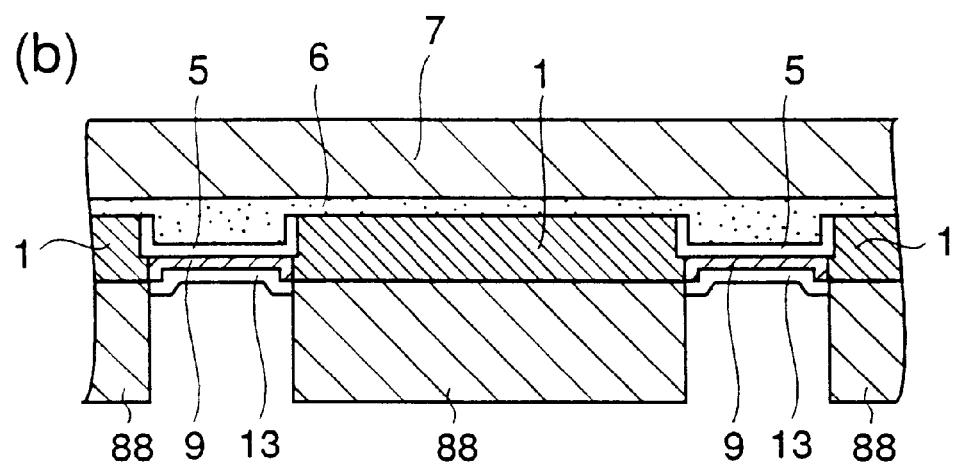
Figure 6:
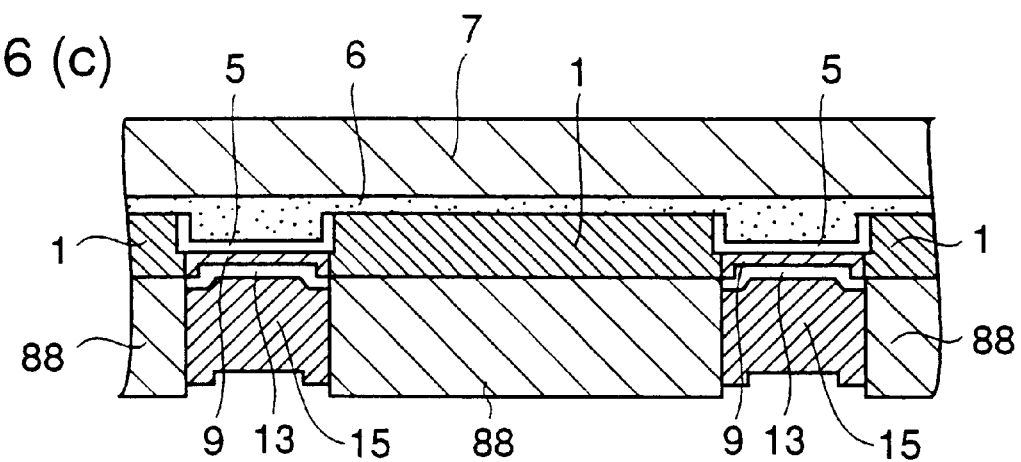

FIGS. 6(a)–6(c) are cross-sectional views illustrating a method of fabricating a semiconductor device in the processing order according to the fourth embodiment. First, the steps illustrated in FIGS. 1(a)–1(d) for the first embodiment are performed. Next, a thick acrylic photoresist 88 of a thickness of about 40 $\mu$m is formed on a region of the rear surface of the semiconductor substrate except the region corresponding to the first chip separating groove 2. The step of forming the second chip separating groove 22 by etching the rear surface of the semiconductor substrate 1, using the photoresist 88 as a mask, until the bottom of the first metallization layer 5 is exposed, the step of selectively etching only the Ti layer which is the lower layer of the first metallization layer 5 with a sulfuric acid/hydrogen peroxide based etchant, and the step of forming the second metallization layer 9 on the internal surface of the second chip separating groove 22 by Ni based non-electrolytic plating after the Au layer is exposed, being performed in this order, are the same as in the first embodiment. FIG. 6(a) is a cross-sectional view immediately after the second metallization layer 9 is formed. Next, the buffer metallization layer 13 of a thickness of about 5 $\mu$m comprising Au or Cu is formed on the surface of the second metallization layer 9 opposite the semiconductor substrate side and the hard metallization layer 15 of a thickness of about 40 $\mu$m comprising Ni or Ni—P is formed on the surface of the buffer layer 13 opposite the semiconductor substrate side, both of which are successively formed by electrolytic plating or non-electrolytic plating using the photoresist 88 again as a mask. Furthermore, after removing the photoresist 88, the electrical supply layer comprising a Ti/Au laminated layer film is formed on the entire rear surface of the semiconductor substrate including both the surface opposite the semiconductor substrate side and lateral surface of the hard metallization layer 15. The step of forming the PHS layer comprising Au or Cu on the entire surface of the electrical supply layer opposite the semiconductor substrate side by electrolytic plating, the step of leveling the surface of the PHS layer opposite the semiconductor substrate side and exposing the surface of the hard metallization layer 15 opposite the semiconductor substrate side, and the step of cutting the metallization layer in the chip separating groove region, these processes being performed in this order, are the same as the steps illustrated in FIGS. 5(e)–5(g) in the third embodiment. Through these processes, a semiconductor device similar to the one shown in FIG. 7, the third embodiment, which comprises the semiconductor chip 1 having a semiconductor element on its surface, the PHS layer 10 formed on the rear surface of the semiconductor chip, and the hard metallization layer 15 formed along and beyond a complete circumference of the lateral surface of the PHS layer 10, is obtained. However, the semiconductor device of the fourth embodiment differs from the one in FIG. 7 in that the buffer metallization layer 13 does not exist between the PHS layer 10 and the semiconductor chip 1. However, since the buffer metallization layer 13 comprises Au or Cu like the PHS layer 10 and, furthermore, its thickness is small compared to the PHS layer, whether there is the buffer metallization layer 13 between the PHS layer 10 and the semiconductor chip 1 hardly has any effect on the operation of this semiconductor device.

In the fourth embodiment, since the hard metallization layer 15 or the PHS layer 10 cover the entire rear surface of the semiconductor substrate, the strength of the mechanical connection between semiconductor chips increases, and a metal protrusion is not formed in the peripheral region of the front surface of the semiconductor substrate, which prevents a crack in the semiconductor substrate from occurring. The rupture of the first metallization layer 5 or its protrusion from the rear surface of the semiconductor substrate due to the polishing or the thinning of the rear surface of the semiconductor substrate does not occur, either. Furthermore, since the buffer metallization layer 13 comprising Au or Cu, which is softer than Ni or Ni—P constituting the hard metallization layer 15 is present in the chip separating groove region, the metallization layer in the chip separating region can easily be cut. As described above, by using this fabricating method, stable fabricating processes having a good yield can be obtained. Furthermore, since the hard metallization layer 15 comprising Ni or Ni—P, which is harder than Au or Cu, is formed in the chip separating groove region of the rear surface of the semiconductor substrate, when the metallization layer in the chip separating groove region is cut, the hard metallization layer 15 is cut on the rear surface side of the semiconductor substrate, not the PHS layer 10. The burrs produced at this hard metallization layer 15 are smaller than those produced when the PHS layer 10 is cut. Therefore, in a subsequent step of mounting the semiconductor device obtained, after the above cutting process, onto a chip carrier, the adhesion between the PHS layer 10 and the chip carrier becomes is better than in a case where the burrs of the PHS layer protrude from the surface. Therefore, a semiconductor device of high reliability having a good heat dispersion characteristic can be obtained.

[Embodiment 5]

A fifth embodiment of the present invention will be described.

In a fabricating method of a semiconductor device according to the fifth embodiment, the hard metallization layer 15 described in the fabricating method shown in FIGS. 5(a)–5(g) and FIGS. 6(a)–6(c) of the third and the fourth embodiments comprises Au—Sn alloy instead of Ni or Ni—P. Except for the difference in the material used for the hard metallization layer, each step is identical to that in the third and the fourth embodiments.

In the fifth embodiment, since the mechanical strength connecting semiconductor chips is excellent and there is no metal protrusion in the peripheral region of the front surface of the semiconductor substrate, a crack in the semiconductor substrate can be prevented from occurring and the rupture of the first metallization layer 5 or its protrusion from the rear surface of the semiconductor substrate due to the polishing or the thinning of the rear surface of the semiconductor substrate does not occur. Furthermore, the burrs produced at a section of the hard metallization layer 15 when it is cut are melted when the semiconductor device and a chip carrier are heated to about 300° C. for mounting the semiconductor device onto the chip carrier because this hard metallization layer 15 comprises Au—Sn alloy, and the adhesion between the PHS layer 10 and the chip carrier is not deteriorated. Therefore, a semiconductor device of high reliability having a good heat dispersion characteristic can be obtained.

[Embodiment 6]

A sixth embodiment of the present invention will be described.

Figure 8:
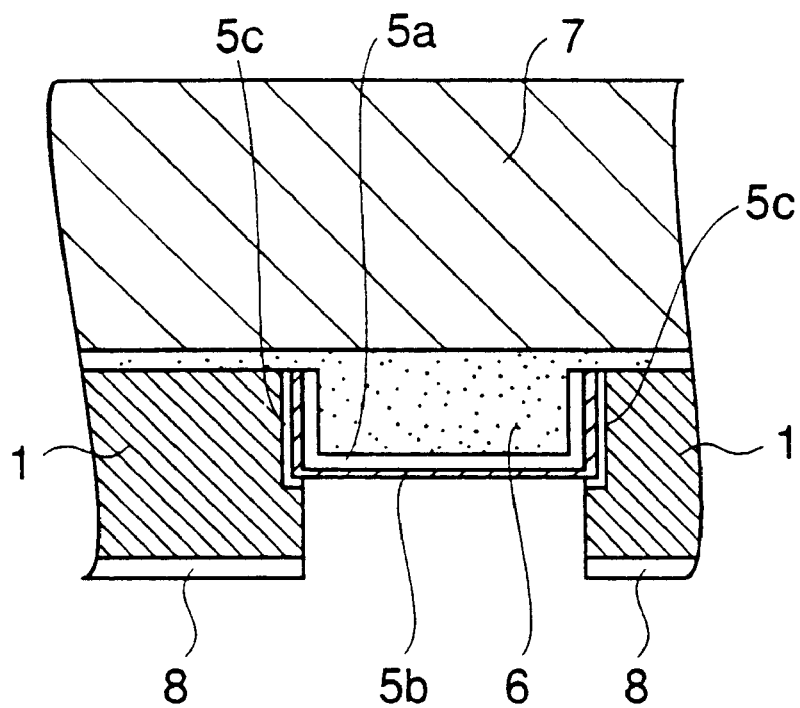
FIG. 8 is a cross-sectional view illustrating a method of fabricating a semiconductor device according to a sixth embodiment of the present invention.
Figure 9:
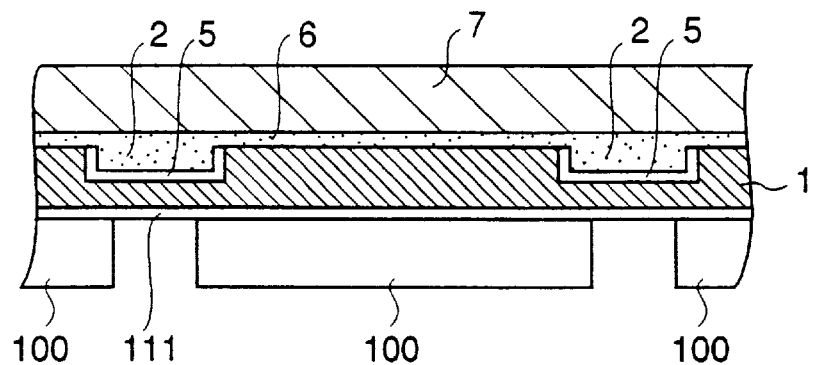
FIGS. 9(a)–9(d) are cross-sectional views illustrating a method of fabricating a semiconductor device according to a seventh embodiment of the present invention.
Figure 9:
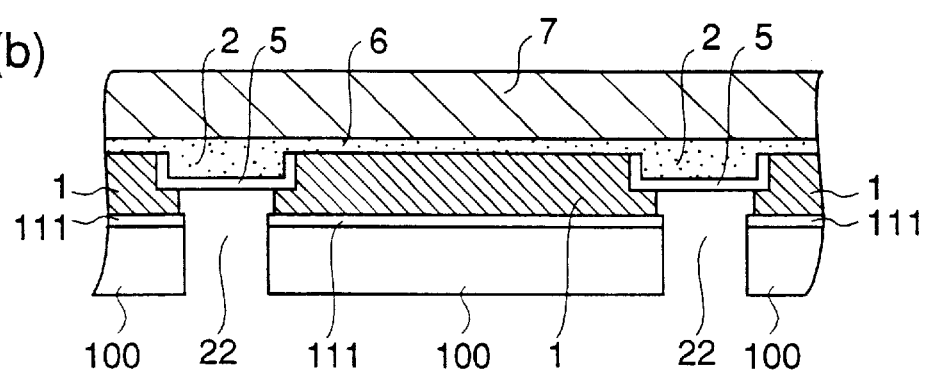
Figure 9:
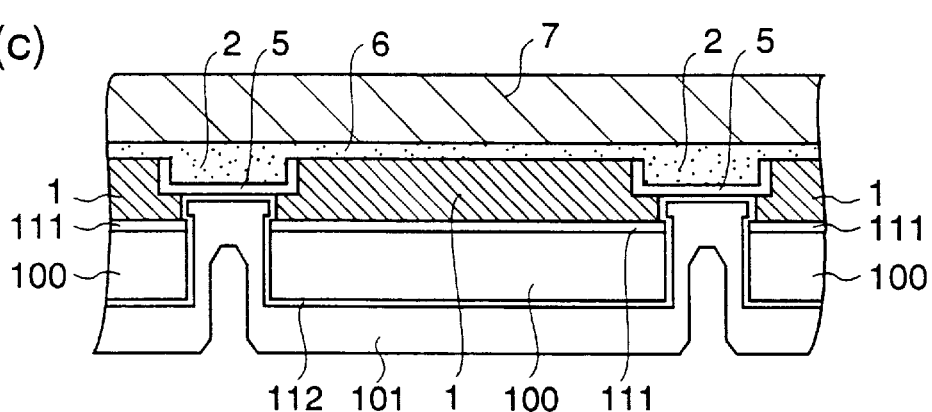
Figure 9:
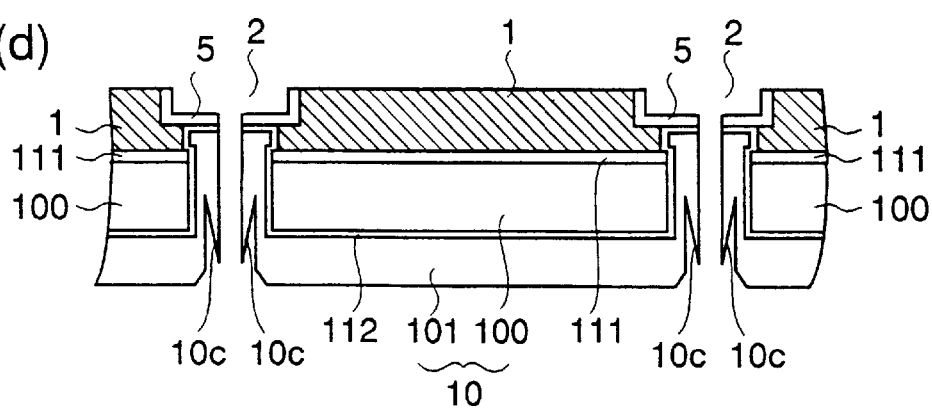

FIG. 8 is a cross-sectional view illustrating a method of fabricating a semiconductor device according to the sixth embodiment. In the method of fabricating the semiconductor device according to this embodiment, the first metallization layer 5 described in the fabricating methods illustrated for the first, second, third, fourth, and fifth embodiments comprises a triple layered film of Ti/Pd/Au instead of the double layered film of Ti/Au. First, the steps illustrated in FIGS. 1(a)–1(d) for the first embodiment are performed. The first metallization layer 5 comprising the triple layered film is formed by vacuum evaporation or sputtering deposition and lift-off as in the first, second, third, fourth, and fifth embodiments. Next, as shown in FIG. 1(e), the second chip separating groove is formed by etching. Furthermore, as shown in FIG. 8, only the Ti layer 5c which is the lowermost layer of the first metallization layer 5 exposed in the second chip separating groove 22 is selectively etched and the Pd layer 5b is exposed. Then, using this Pd layer 5b as an activating layer (catalyst), the second metallization layer 9 is formed by performing Ni based non-electrolytic plating. The steps to follow from this point can be any of the steps illustrated for the first, second, third, fourth, and fifth embodiments.

In the sixth embodiment, since the mechanical strength connecting semiconductor chips is excellent as described above and there is no metal protrusion in the peripheral region of the front surface of the semiconductor substrate, a crack in the semiconductor substrate can be prevented from occurring and the rupture of the first metallization layer 5 or its protrusion from the rear surface of the semiconductor substrate in a step of polishing or thinning the rear surface of the semiconductor substrate does not occur. Furthermore, the second metallization layer 9 comprising Ni or Ni based alloy can easily be formed by Ni based non-electrolytic plating using the Pd layer 5b as the activating layer (catalyst). As described above, by using this fabricating method, stable fabricating processes having a good yield can be obtained.

[Embodiment 7]

A seventh embodiment of the present invention will be described.

Figure 10:
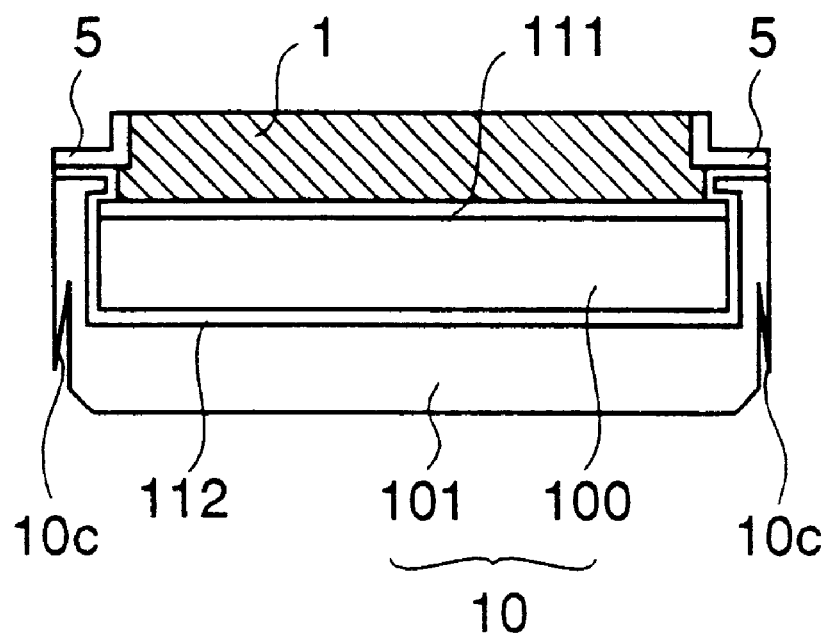
FIG. 10 is a cross-sectional view illustrating a semiconductor device according to the seventh embodiment of the present invention.
Figure 11:
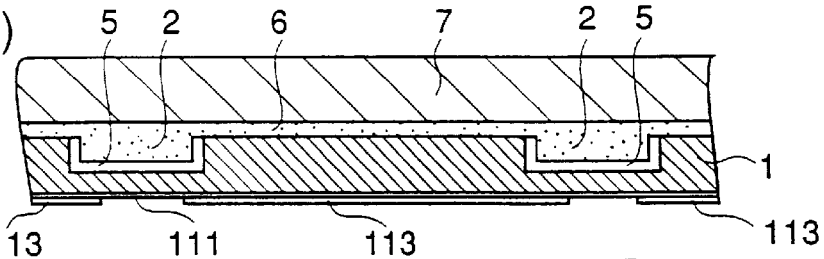
FIGS. 11(a)–11(e) are cross-sectional views illustrating a method of fabricating a semiconductor device according to an eighth embodiment of the present invention.
Figure 11:
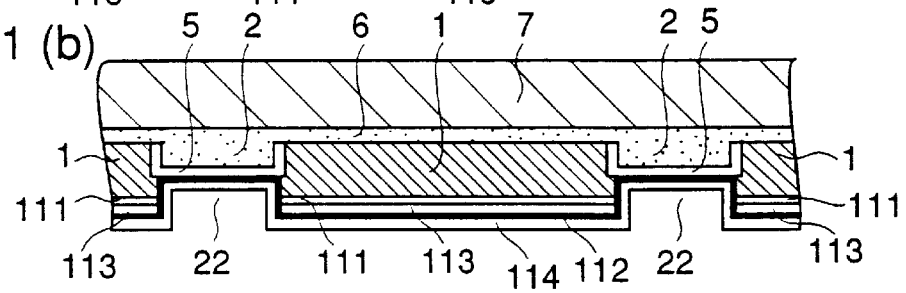
Figure 11:
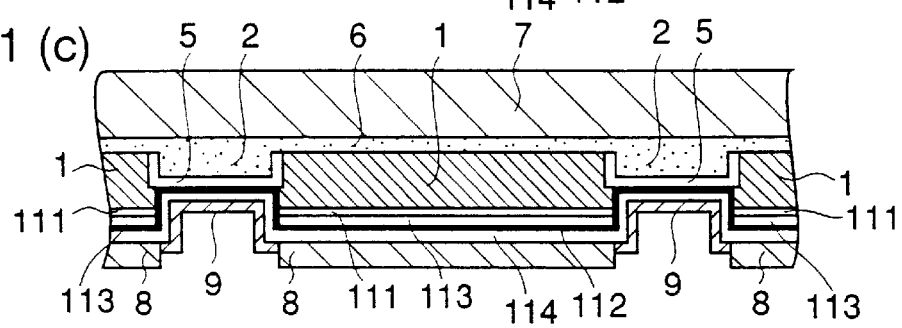
Figure 11:
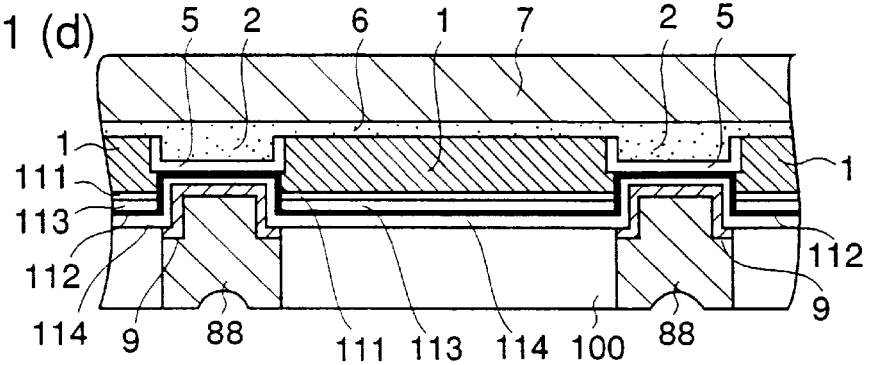
Figure 11:
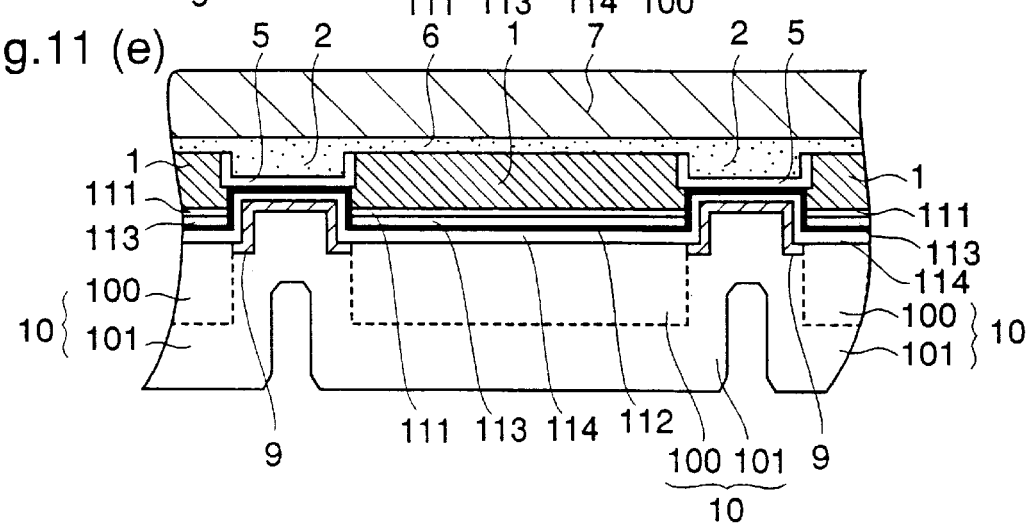

FIGS. 9(a)–9(d) are cross-sectional views illustrating a fabricating method of a semiconductor device in the processing order according to the seventh embodiment. First, the steps illustrated in FIGS. 1(a)–1(d) for the first embodiment are performed. Next, the electrical supply layer 111 of a thickness of about 0.5 μm is formed on the entire rear surface of the semiconductor substrate by Ni based non-electrolytic plating. Then, after the formation of the Ni layer, the Ni at the surface of the Ni layer opposite the semiconductor substrate side is replaced with Au by substitutional non-electrolytic Au plating. Furthermore, a thick photoresist of a thickness of about 40 μm is formed in the chip separating groove region of the surface of the electrical supply layer opposite the semiconductor substrate side and, using this as a mask, the first PHS layer 100 of a thickness of 20–30 μm comprising Au or Cu is formed by electrolytic plating (FIG. 9(a)). Next, using this first PHS layer 100 as a mask, the electrical supply layer 111 in the chip separating groove region is etched and removed by ion milling. Furthermore, in the same region, using the first electrical supply layer 111 and the first PHS layer 100 as a mask, the semiconductor substrate 1 is etched until the bottom of the first metallization layer 5 is exposed, thereby forming the second chip separating groove 22 (FIG. 9(b)). Next, the second electrical supply layer 112 of a thickness of about 0.5 μm is formed on the entire rear surface of the semiconductor substrate including the surface opposite the semiconductor substrate side the lateral surface of the first PHS layer 100, and the internal surface of the second chip separating groove 22 using the Ni based non-electrolytic plating and the substitutional non-electrolytic Au plating, which were used to form the first electrical supply layer. Furthermore, the second PHS layer 101 of a thickness of about 30 μm comprising Au or Cu is formed on the entire surface of the second electrical supply layer opposite the semiconductor substrate side by electrolytic plating (FIG. 9(c)). There is a recess having a depth almost equal to the sum of the thickness of the first PHS layer 100 and the depth of the second chip separating groove 22 at the chip separating groove region of the surface of the second PHS layer opposite the semiconductor substrate side. Next, the surface of the second PHS layer 101 opposite the semiconductor substrate side is smoothed by mechanical polishing or electric discharge processing or the like. Then, the glass plate 7 is removed from the semiconductor substrate 1 and washed, and a surface of the second PHS layer 101 opposite the semiconductor substrate side is adhered to an expand tape and the wafer is cut with a dicing blade at the inside of the chip separating groove region (FIG. 9(d)). In this cutting process, the burrs 10c are produced at the section of the second PHS layer 101. However, since there is a recess at the chip separating groove region of the surface of the second PHS layer opposite the semiconductor substrate side, the burrs 10c are contained in this recess and do not protrude from the surface of the second PHS layer opposite the semiconductor substrate side directly under the semiconductor chip as illustrated in the figure. Through the processes described above, a semiconductor device comprising the semiconductor chip 1 having a semiconductor element on its surface and the PHS layer 10 comprising the first PHS layer 100 and the second PHS layer 101 and formed on the rear surface of this semiconductor chip 1 can be fabricated as shown in FIG. 10.

In this seventh embodiment, since the PHS layer 10 is covers on the entire rear surface of the semiconductor substrate, the strength of the mechanical connection between semiconductor chips increases and there is no metal protrusion in the peripheral region of the front surface of the semiconductor substrate. A crack in the semiconductor substrate due to this protrusion is prevented from occurring, and the rupture of the first metallization layer 5 or its protrusion from the rear surface of the semiconductor surface due to the polishing or the thinning of the rear surface of the semiconductor substrate does not occur. As described above, by using this fabricating method, stable fabricating processes having a good yield can be obtained. Furthermore, since the first PHS layer 100 is not in the chip separating groove, the surface of the second PHS layer 101 opposite the semiconductor substrate side, immediately after its formation, has a recess of a depth equal to the sum of the thickness of the first PHS layer 100 and the depth of the second chip separating groove 22. Therefore, it becomes possible to contain within the recess the burr 10c of the second PHS layer which is produced when the metallization layer in the chip separating groove region is cut. That is, in the semiconductor device comprising the semiconductor chip 1 obtained after the cutting process and the PHS layer 10 formed on the rear surface of the semiconductor chip, the burrs of the PHS layer 10 do not protrude from the surface of the PHS layer opposite the semiconductor substrate side. Therefore, in a subsequent step of mounting this semiconductor device onto a chip carrier, the adhesion between the PHS layer and the chip carrier is excellent, and a semiconductor device of high reliability having a good heat dispersion characteristic can be obtained.

A Ti/Au laminated layer film formed by vacuum evaporation or sputtering deposition can be used for the first electrical supply layer instead of a Ni based plating layer. In that case, it is possible to perform the etching of the first electrical supply layer in the chip separating groove region by wet etching which uses an iodine/potassium iodide based Au etchant and a hydro fluoric acid based Ti etchant. As described above, if the first electrical supply layer comprises the Ti/Au laminated layer film, this layer can easily be formed by vacuum evaporation or sputtering deposition. Since it is the Ti layer which makes contact with the rear surface of the semiconductor substrate, the adhesion between the first electrical supply layer and the semiconductor substrate is excellent, and since it is the Au layer which is exposed to the surface immediately after the formation of the electrical supply layer, the PHS layer can easily be formed by depositing Au on the electrical supply layer by electrolytic plating.

The thickness of the second electrical supply layer 112 comprising a Ni based plating layer can be increased from 0.5 μm to 3–5 μm. In that case, since the second electrical supply layer 112 located on the semiconductor substrate side of the second PHS layer 101 comprises Ni which is harder than Au or Cu constituting the PHS layer and is as thick as 3–5 μm, burrs which are a portion of PHS metal protruding from the front surface of the semiconductor substrate produced at a section of the PHS layer during a step of cutting the metallization layer in the chip separating groove region can be prevented.

[Embodiment 8]

An eighth embodiment of the present invention will be described.

Figure 12:
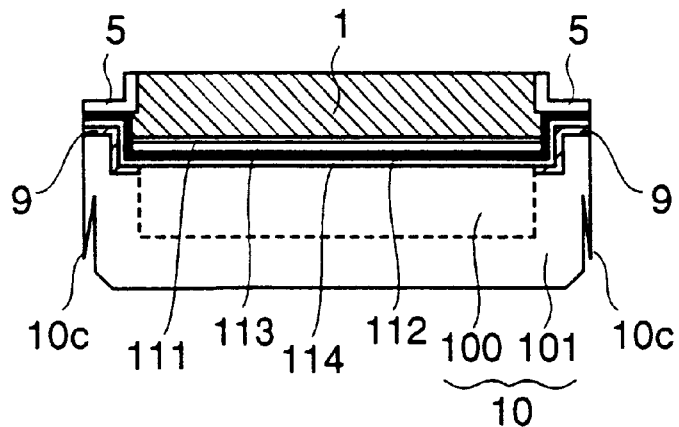
FIG. 12 is a cross-sectional view illustrating the semiconductor device according to the eighth embodiment of the present invention.

FIGS. 11(a)–11(e) are cross-sectional views illustrating a method of fabricating a semiconductor device in the processing order according to the eighth embodiment. First, the steps illustrated in FIGS. 1(a)–1(d) for the first embodiment are performed. Next, the first electrical supply layer 111 of a thickness of about 0.5 μm is formed on the entire rear surface of the semiconductor substrate using Ni based non-electrolytic plating. After the Ni layer is formed, its surface is replaced with Au by substitutional non-electrolytic Au plating. Furthermore, a photoresist is formed in the chip separating groove region of the surface of the electrical supply layer 111 opposite the semiconductor substrate side. Using this photoresist as a mask, the plating metallization layer 113 of a thickness of about 5 μm comprising Au or Cu is formed by electrolytic plating, and then, the photoresist is removed (FIG. 11(a)). Next, using this plating metallization layer 113 as a mask, the electrical supply layer 111 in the chip separating groove region is etched and removed. Furthermore, in the same region, the second chip separating groove 22 is formed by etching the semiconductor substrate 1 until the bottom of the first metallization layer 5 is exposed, using the first electrical supply layer 111 and the plating metallization layer 113 as a mask. Next, the second electrical supply layer 112 of a thickness of about 0.5 μm is formed on the entire rear surface of the semiconductor substrate including the inside of the second chip separating groove 22 using Ni based non-electrolytic plating and substitutional non-electrolytic Au plating, and the buffer layer 114 of a thickness of about 5 μm comprising Au or Cu is formed on the entire surface of the second electrical supply layer 112 opposite the semiconductor substrate side using electrolytic plating (FIG. 11(b)). Then, the photoresist 8 is formed in the region of the surface of the buffer layer 114 opposite the semiconductor substrate side, except for the chip separating groove region, and using this photoresist 8 as a mask, the second metallization layer 9 of a thickness of 3–5 μm comprising Ni or Ni—P is selectively formed by non-electrolytic plating (FIG. 11(c)). After the photoresist 8 is removed, the photoresist 88 of a thickness of about 40 μm is formed in the chip separating groove region, and using this photoresist 88 as a mask, the first PHS layer 100 of a thickness of 20–30 μm comprising Au or Cu is formed by electrolytic plating (FIG. 11(d)). Furthermore, the photoresist 88 is removed and the second PHS layer 101 of a thickness of about 30 μm comprising Au or Cu is formed on the entire rear surface of the semiconductor substrate by electrolytic plating (FIG. 11(e)), thereby obtaining the PHS layer 10 comprising the first PHS layer 100 and the second PHS layer 101. In the chip separating groove region of the surface of the second PHS layer opposite the semiconductor substrate side, there is a recess having a depth almost equal to the sum of the thickness of the first PHS layer 100 and the depth of the second chip separating groove 22 having the second metallization layer 9 on its internal surface. Then, the surface of the second PHS layer 101 opposite the semiconductor substrate side is smoothed by mechanical polishing or electric discharge processing. Then, the glass plate 7 is removed from the semiconductor substrate 1 which is washed, and the surface of the second PHS layer 101 opposite the semiconductor substrate side is adhered to an expand tape and the semiconductor substrate is cut in the chip separating groove region with a dicing blade. In this cutting process, burrs are produced at a section of the second PHS layer 101. However, since there is the recess described above in the chip separating groove region on the surface the second PHS layer opposite the semiconductor substrate side, the burrs are contained in this recess and do not protrude from the surface of the second PHS layer opposite the semiconductor substrate side directly under the semiconductor chip. Through the processes described above, a semiconductor device as illustrated in FIG. 12 comprising the semiconductor chip 1 having a semiconductor element on its front surface and the PHS layer 10 on the rear surface of the semiconductor chip 1 comprising the first PHS layer 100 and the second PHS layer 101 is fabricated.

In this eighth embodiment, since the second PHS layer 101 covers the entire rear surface of the semiconductor substrate, the strength of the mechanical connection between semiconductor chips increases and there is no metal protrusion in the peripheral region of the front surface of the semiconductor substrate. A crack in the semiconductor substrate due to this protrusion is prevented from occurring, and the rupture of the first metallization layer or its protrusion from the rear surface of the semiconductor substrate due to the polishing or the thinning of the rear surface of the semiconductor substrate does not occur. Furthermore, since the second metallization layer 9 located to the semiconductor substrate side of the second PHS layer 101 comprises Ni or Ni—P which are harder than Au or Cu constituting the PHS layer 10, the burrs which are produced at a section of the second PHS layer 101 and protrude to the front surface side of the semiconductor substrate in a step of cutting the metallization layer in the chip separating groove region can be prevented. And, since the buffer metallization layer 114 is present, the metallization layer in the chip separating groove region can easily be cut. As described above, by using this fabricating method, stable fabricating processes having a good yield can be obtained. Furthermore, since the first PHS layer 100 is not present in the second chip separating groove region, there is a recess on the surface of the second PHS layer 101 opposite the semiconductor substrate side, immediately after its formation, having a depth equal to the sum of the thickness of the first PHS layer 100 and the depth of the second chip separating groove 22 having the second metallization layer 9 on its internal surface. Therefore, it is possible to contain within the recess the burrs of the second PHS layer 101 produced when the metallization layer in the chip separating groove region is cut. That is, in a semiconductor device comprising the semiconductor chip 1 obtained after the cutting process and the PHS layer 10 formed on the rear surface of the semiconductor chip 1, the burrs of the PHS layer 10 do not protrude from the surface of the PHS layer. Therefore, in the subsequent step of mounting this semiconductor device onto a chip carrier, the adhesion between the PHS layer and the chip carrier is excellent and, because of this, a semiconductor device of high reliability and having a good heat dispersion characteristic can be obtained. Furthermore, in the seventh embodiment, in order to prevent burrs which protrude from the front surface of the semiconductor substrate at a section of the second PHS layer, a method in which the thickness of the second electrical supply layer comprising Ni or Ni—P is increased from 0.5 $\mu$m to 3–5 $\mu$m. However, since Ni and Ni—P have thermal conductivities lower than that of Au and Cu, if the thickness of this second electrical supply layer formed on the entire rear surface of the semiconductor substrate is increased, the heat conduction from the semiconductor chip to the PHS layer is degraded. On the other hand, since in this eighth embodiment the second metallization layer of a thickness of 3 to 5 $\mu$m comprising Ni or Ni—P is formed only in the second chip separating groove region, the heat conduction from the semiconductor chip to the PHS layer is not degraded, and the burrs protruding from the front surface of the semiconductor substrate at a section of the PHS layer can also be prevented.

[Embodiment 9]

A ninth embodiment of the present invention will be described.

Figure 13:
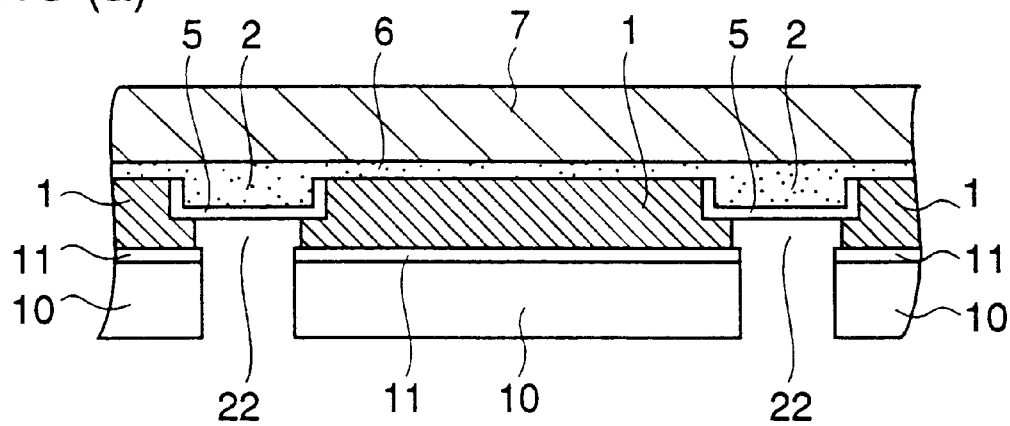
FIGS. 13(a)–13(b) are cross-sectional views illustrating a method of fabricating a semiconductor device according to a ninth embodiment of the present invention.
Figure 13:
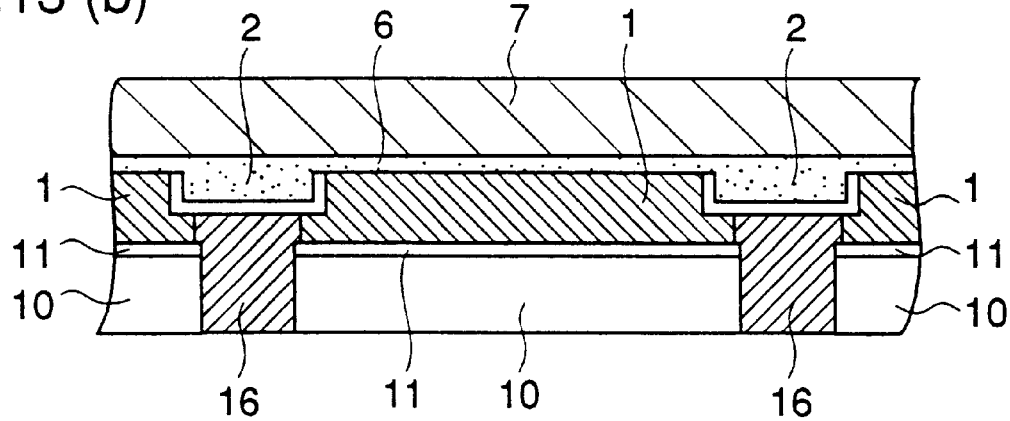
Figure 14:
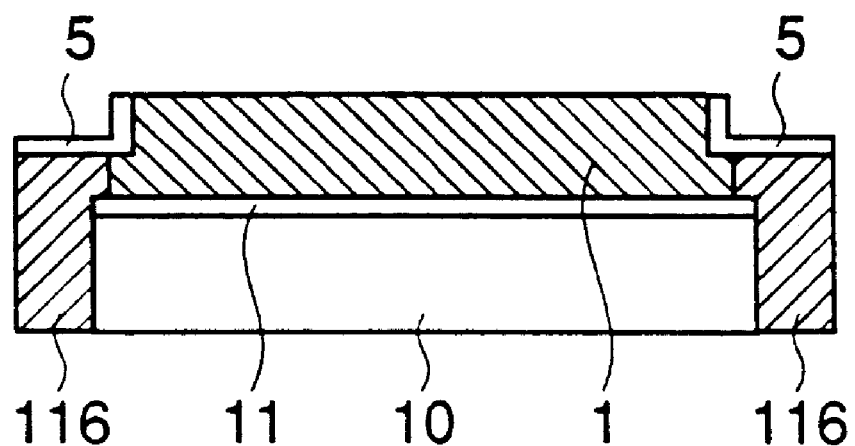
FIG. 14 is a cross-sectional view illustrating a semiconductor device according to the ninth embodiment of the present invention.
Figure 15:
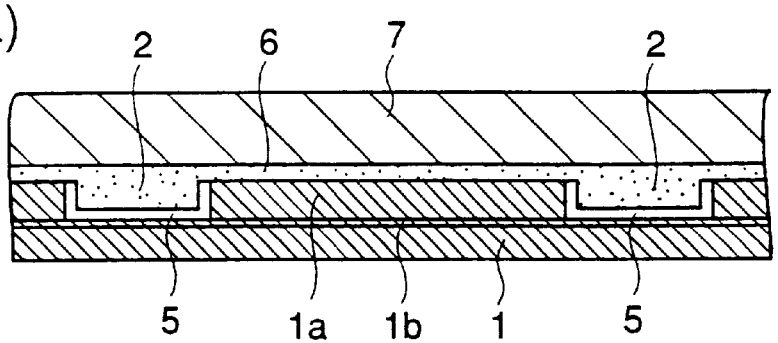
FIGS. 15(a)–15(d) are cross-sectional views illustrating a method of fabricating a semiconductor device according to a tenth embodiment of the present invention.
Figure 15:
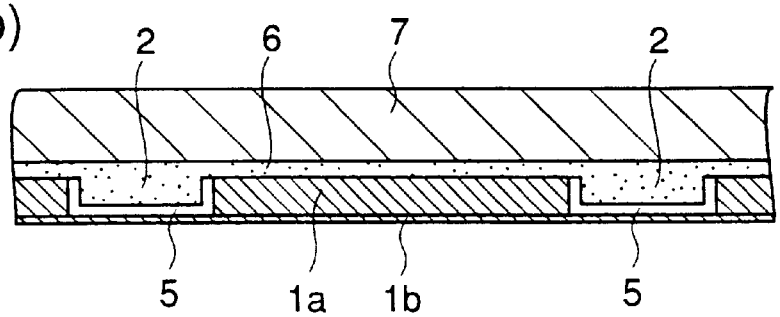
Figure 15:
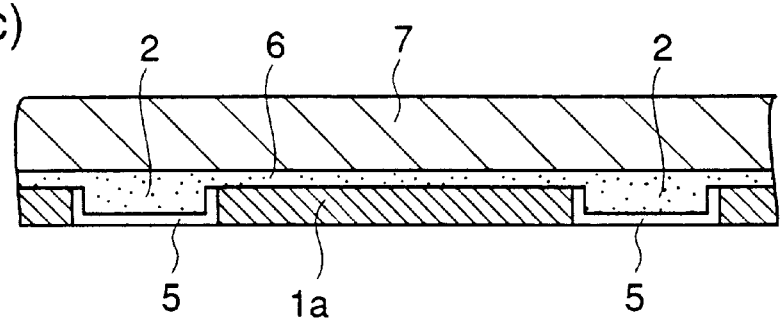
Figure 15:
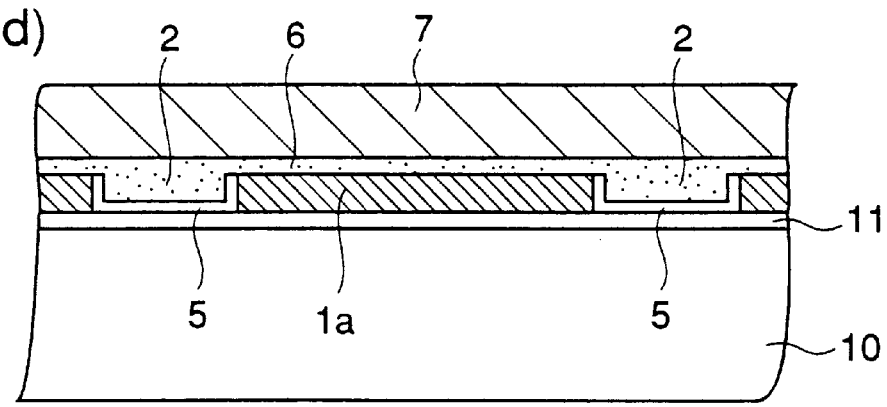

FIGS. 13(a)–13(b) are cross-sectional views illustrating a method of fabricating a semiconductor device in the processing order according to the ninth embodiment. First, the steps illustrated in FIG. 1(a)–1(d) for the first embodiment are performed. Next, steps similar to those illustrated in FIGS. 9(a)–9(b) for the seventh embodiment are performed. That is, the electrical supply layer 11 of a thickness of about 0.5 $\mu$m is formed on the entire rear surface of the semiconductor substrate using Ni based non-electrolytic plating and substitutional non-electrolytic Au plating. Furthermore, a thick photoresist of a thickness of about 40 $\mu$m is formed in the chip separating groove region of the surface of the electrical supply layer 11 opposite the semiconductor substrate side, and using this resist as a mask, the PHS layer 10 of a thickness of 20–30 $\mu$m comprising Au or Cu is formed by electrolytic plating. Next, using this PHS layer 10 as a mask, the electrical supply layer 11 in the chip separating groove region is etched away by ion milling. Furthermore, in the same region, using the electrical supply layer 11 and the PHS layer 10 as a mask, the semiconductor substrate 1 is etched until the bottom of the first metallization layer 5 is exposed, thereby forming the second chip separating groove 22. The cross-sectional view of the wafer at this stage is shown in FIG. 13(a), and this is the same as that shown in FIG. 9(b). Next, the ceramic paste 16, in which ceramic particles are dispersed in a solvent, is applied to the entire rear surface of the semiconductor substrate. The paste 16 is then dried and the solvent is evaporated. Furthermore, the entire rear surface of the semiconductor substrate is polished and leveled so that the surface of the PHS layer 10 opposite the semiconductor substrate side is exposed. By this process, only the chip separating groove region is filled with the ceramic paste 16 (FIG. 13(b)). Next, by heat-treating the wafer at a temperature of 100–200° C., the ceramic paste 16 is cured. Then, the glass plate 7 is removed from the semiconductor substrate 1 which is washed, and the surface of the PHS layer 10 opposite the semiconductor substrate side is adhered to an expand tape and the wafer is cut in the chip separating groove region with a dicing blade. Through the above processes, the semiconductor device comprising the semiconductor chip 1 having a semiconductor element formed on its surface, the PHS layer 10 formed on the rear surface of the semiconductor chip 1, and the ceramic layer 116 formed on the lateral surface of the PHS layer 10 is fabricated. As the ceramic paste, a silica (SiO) based ceramic paste which can be used for coating and normal temperature curing, such as "Cerama Coat 512" produced by Aremco Products, U.S.A. is available.

In the ninth embodiment, since the ceramic layer 116 of almost the same thickness as the PHS layer 10 is disposed in the chip separating groove region on the rear surface of the semiconductor chip and the PHS layer 10 is disposed on the remaining region, the strength of the mechanical connection between semiconductor chips from the step of forming the PHS layer to the step of cutting the metallization layer and ceramic layer in the chip separating groove region is excellent. Since the ceramic layer 116 or the PHS layer 10 cover the entire rear surface of this semiconductor substrate, and since the depth of the first chip separating groove 2 is smaller than the thickness of the semiconductor substrate 1 which is thinned by the polishing or the thinning of the rear surface of the semiconductor substrate, that is, a semiconductor substrate of a certain thickness is left under the first chip separating groove 2 immediately after the polishing or the thinning of the rear surface of the semiconductor substrate, it is not necessary to require the first metallization layer 5 to have mechanical strength. Therefore, it is possible to make the first metallization layer as thin as 1 $\mu$m or less, so that a protrusion of thick metal such as the previously mentioned plating protrusion is not formed in the peripheral region of the front surface of the semiconductor substrate and a crack in the semiconductor substrate which occurs when the glass plate is adhered to the wafer due to this protrusion is prevented. Furthermore, since there is a semiconductor substrate of a certain thickness left under the first chip separating groove 2 immediately after the polishing or the thinning of the rear surface of the semiconductor substrate, the first metallization layer 5 is not exposed on the rear surface of the semiconductor substrate due to the polishing or thinning processes. Therefore, the difficulty in a subsequent photolithography process because of the rupture of the first metallization layer 5 due to the polishing or other thinning process or its protrusion from the rear surface of the semiconductor substrate does not arise. As described above, by using this fabricating method, stable fabricating processes having a good yield can be obtained. And, since the ceramic layer 116 is formed in the chip separating groove region of the rear surface of the semiconductor substrate, burrs are not produced at this ceramic layer during cutting of the metallization layer and the ceramic layer in this region, and the adhesion between the PHS layer and a chip carrier can be excellent during a subsequent step of mounting the semiconductor device, after the above cutting process, onto the chip carrier. Therefore, a semiconductor device of high reliability having a good heat dispersion characteristic can be obtained.

[Embodiment 10]

A tenth embodiment of the present invention will be described.

Figure 16:
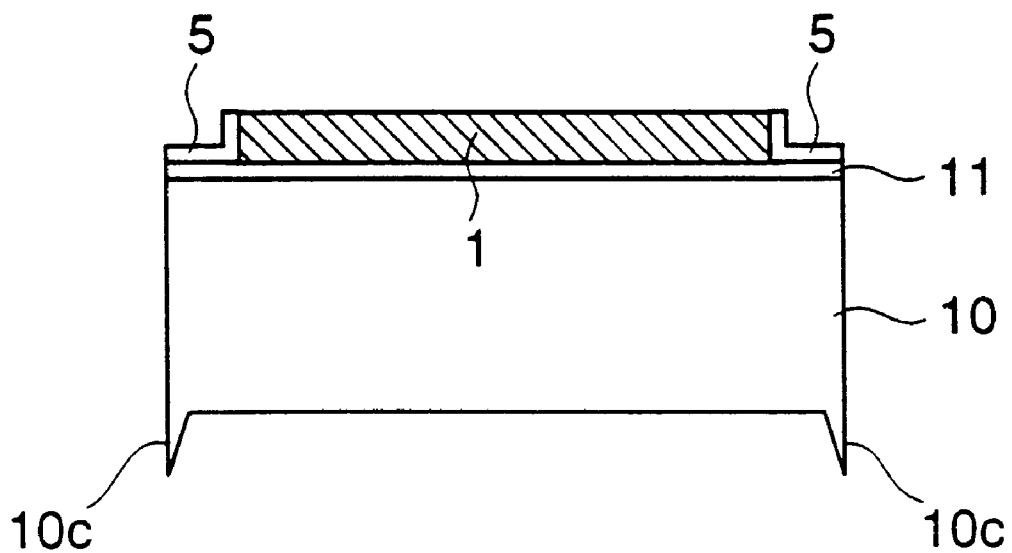
FIG. 16 is a cross-sectional view illustrating a semiconductor device according to the tenth embodiment of the present invention.
Figure 17:
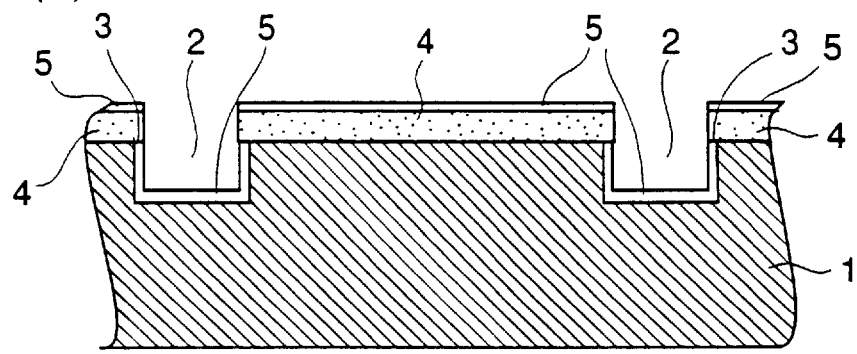
FIGS. 17(a)–17(d) are cross-sectional views illustrating a prior art fabricating method of a semiconductor device where a chip separating groove is formed only from the front surface of a semiconductor substrate.
Figure 17:
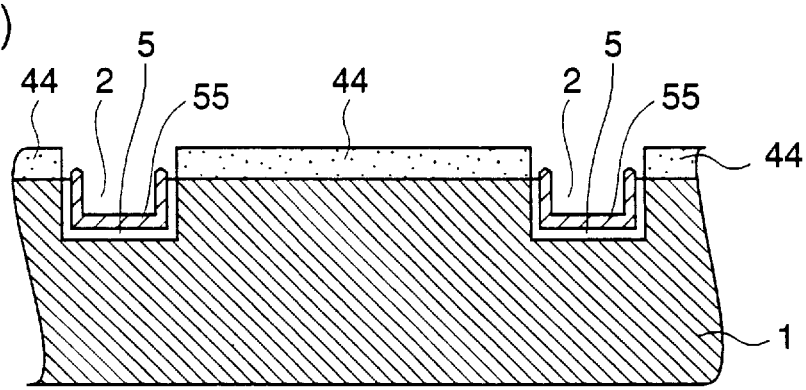
Figure 17:
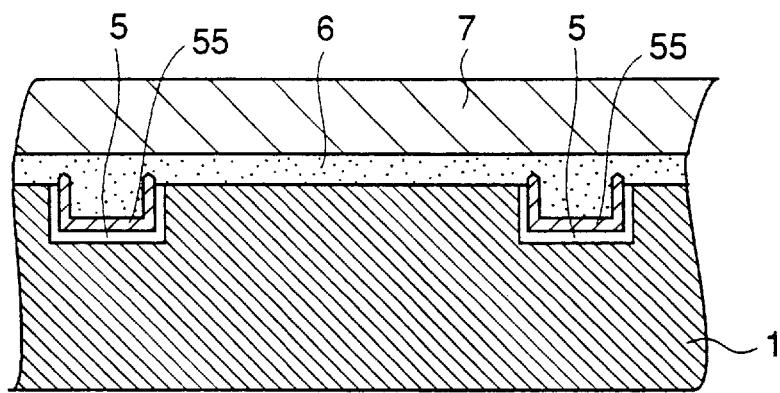
Figure 17:
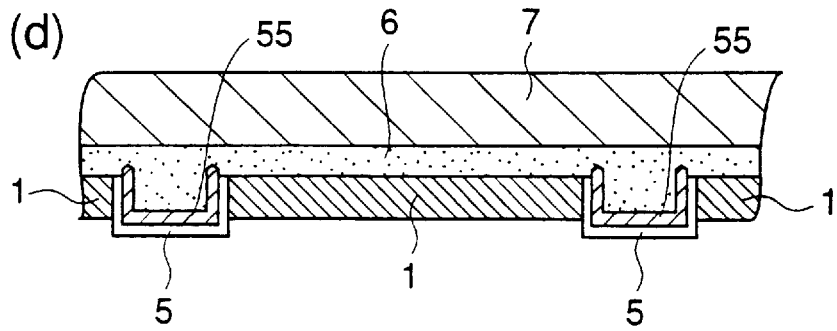
Figure 18:
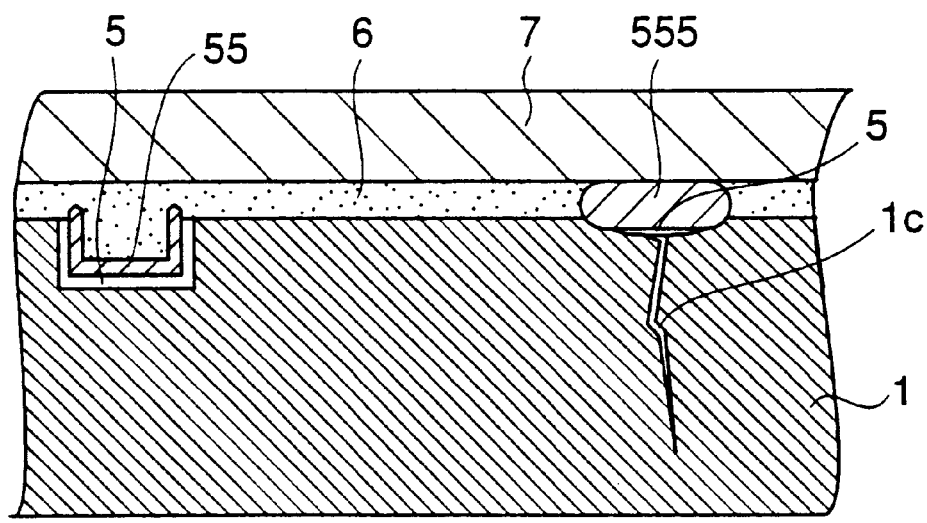
FIG. 18 is a cross-sectional view illustrating a crack which occurs due to a plating protrusion in the prior art fabricating method of the semiconductor device where the chip separating groove is formed only from the front surface of the semiconductor substrate.
Figure 19:
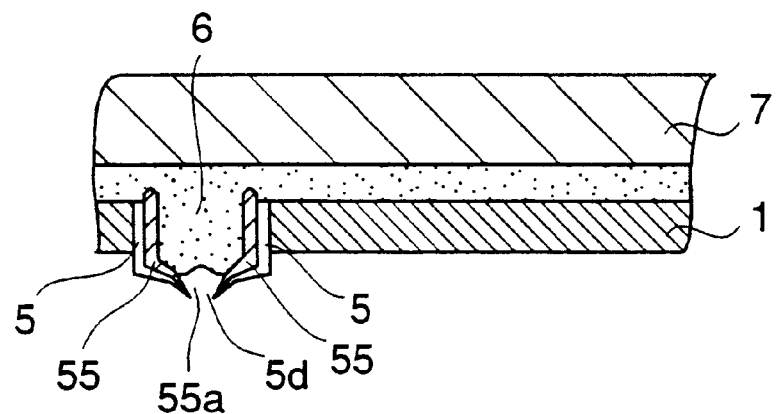
FIG. 19 is a cross-sectional view illustrating a rupture of a metallization layer and a plating layer which occurs in the prior art fabricating method of the semiconductor device where the chip separating groove is formed only from the front surface of the semiconductor substrate.
Figure 20:
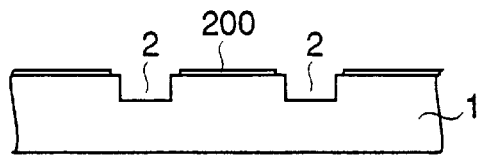
FIGS. 20(a)–20(h) are cross-sectional views illustrating a prior art fabricating method of a semiconductor device where a chip separating groove is formed from both a front surface side and a rear surface side of a semiconductor substrate.
Figure 20:
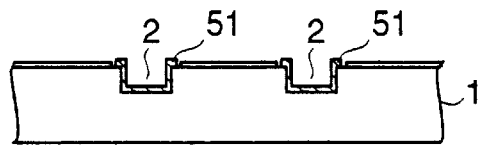
Figure 20:
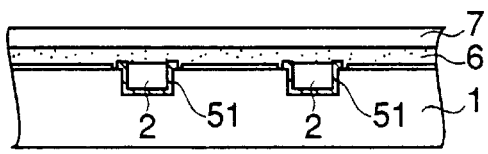
Figure 20:
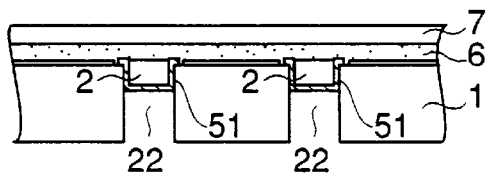
Figure 20:
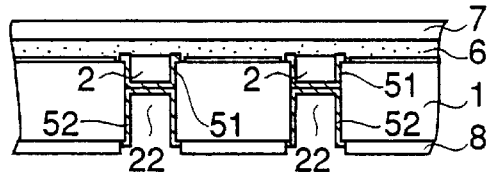
Figure 20:
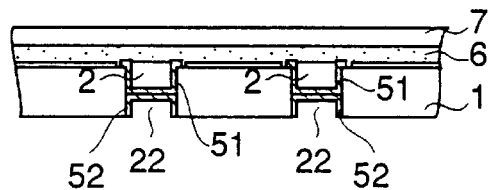
Figure 20:
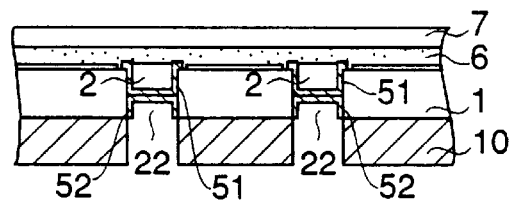
Figure 20:
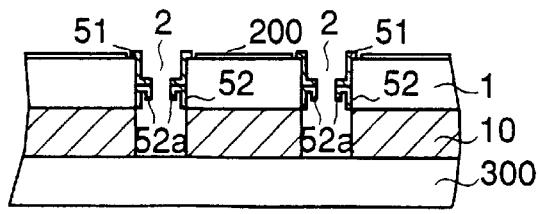

FIGS. 15(a)–15(d) are cross-sectional views illustrating a method of fabricating a semiconductor device in the processing order according to the tenth embodiment. The etching stopper layer 1b comprising $In_{0.5}Ga_{0.5}P$ and the GaAs epitaxial layer 1a of a thickness of 5–10 $\mu$m are successively disposed on the semiconductor (GaAs) substrate 1, and a semiconductor element is formed on the front surface of the GaAs epitaxial layer 1a. First, using a photoresist as a mask, a chip separating groove region in the epitaxial layer 1a is etched from the front surface side using a sulfuric acid/hydrogen peroxide based etchant (for example, $H_2SO_4:H_2O_2:H_2O=3:1:1$). Since this etching automatically stops when the etching stopper layer 1b is exposed, the chip separating groove 2 having a bottom surface is the surface of the etching stopper layer 1b is formed. Next, using vacuum evaporation or sputtering deposition, a Ti/Au laminated layer film of a total film thickness of 250–500 nm is disposed on the entire front surface of the epitaxial layer including the inside of the chip separating groove, and then by removing the photoresist, the metallization layer 5 comprising the Ti/Au laminated layer film is formed on the internal surface of the chip separating groove 2. Then, using the wax 6, the glass plate 7 is adhered to the front surface of the epitaxial layer (FIG. 15(a)). After the semiconductor (GaAs) substrate 1 is thinned by polishing or thinning processes from the rear surface side so that it is thinned to about 15 $\mu$m, the rest of the semiconductor substrate 1 is etched away by the sulfuric acid/hydrogen peroxide based etchant (FIG. 15(b)). This etching also stops automatically when the etching stopper layer 1b is exposed. That is, only the semiconductor substrate 1 is selectively removed. Next, the $In_{0.5}Ga_{0.5}P$ etching stopper layer 1b is etched using a hydrochloric acid based etchant (for example, $HCl:H_2O=3:2$). Since, in this etching, only the etching stopper layer 1b is etched and the GaAs epitaxial layer 1a is not etched, the exposed bottom surface of the metallization layer and the surface of the epitaxial layer 1a make a leveled surface (FIG. 15(c)). Then, the Ti layer, which is the lower layer of the first metallization layer which is exposed on the rear surface of the epitaxial layer is etched and removed. The electrical supply layer 11 is formed on the entire surface, and furthermore the PHS layer 10 comprising Au or Cu is formed by electrolytic plating (FIG. 15(d)). Next, the glass plate 7 is removed from the epitaxial layer 1a which is washed, and the surface of the PHS layer 10 opposite the semiconductor substrate side is adhered to an expand tape and the wafer is cut in the chip separating groove region with a dicing blade. Through the processes described above, a semiconductor device comprising the semiconductor chip 1 having a semiconductor element formed on its surface and the PHS layer 10 formed on the rear surface of the semiconductor chip 1 as illustrated in FIG. 16 is produced.

In this tenth embodiment, since the PHS layer 10 is formed on the entire rear surface of the epitaxial layer 1a, the strength of the mechanical connection between semiconductor chips from the step of forming the PHS layer to the step of cutting each metallization layer in the chip separating groove region is excellent. And, since the PHS layer 10 covers the entire rear surface of the epitaxial layer 1a, and since the removal of the semiconductor substrate 1 is performed not by polishing or thinning processes but by etching, it is not necessary to require the metallization layer 5 to have mechanical strength. Therefore, it is possible to make the metallization layer 5 as thin as 1 $\mu$m or less, and because of this, a thick metal protrusion such as the previously described plating protrusion is not formed in the peripheral region of the front surface of the semiconductor substrate surface, and a crack in the semiconductor substrate which occurs due to this protrusion when the glass plate is attached to the semiconductor substrate can be prevented. Furthermore, since the chip separating groove 2 is formed by etching which automatically stops when the surface of the etching stopper layer 1b is exposed on the semiconductor substrate surface, and since the semiconductor substrate 1 is removed by etching which automatically stops when the surface of the etching stopper layer 1b is exposed on the rear surface of the semiconductor substrate, and the bottom surface of the metallization layer 5 is not exposed on the rear surface of the epitaxial growth layer 1a until the etching stopper layer 1b is selectively etched away, the metallization layer 5 is not ruptured nor does it protrude from the rear surface of the semiconductor substrate at this stage and, therefore, subsequent photolithography process is not difficult. As described above, by using this fabricating method, stable fabricating processes having a good yield can be obtained.

What is claimed is:

1. A method of fabricating a semiconductor device comprising:
    preparing a semiconductor substrate having a front surface, a rear surface, and a thickness between the front surface and the rear surface, including forming a plurality of semiconductor elements on the front surface;
    forming a first chip separating groove, for separating the semiconductor substrate into a plurality of semiconductor chips, at a location of the semiconductor substrate, each semiconductor chip defined by the first chip separating groove including one of the semiconductor elements, the depth of the first chip separating groove being less than a first thickness;
    forming a first metallization layer on an internal surface of the first chip separating groove;
    polishing or thinning the semiconductor substrate at the rear surface such that the semiconductor substrate thickness becomes the first thickness;
    etching a region of the rear surface of the semiconductor substrate opposite the first chip separating groove until the first metallization layer is exposed, thereby forming a second chip separating groove;
    forming a second metallization layer on an internal surface of the second chip separating groove;
    forming a PHS metallization layer for heat dispersion opposite all of the rear surface of the semiconductor substrate and in the second chip separating groove, the PHS metallization layer being softer than the second metallization layer; and
    cutting through the first metallization layer, the second metallization layer, and the PHS metallization layer at the first chip separating groove to form a plurality of semiconductor chips, each semiconductor chip comprising a part of the PHS metallization layer.

2. The method of claim 1 wherein forming the PHS metallization layer comprises:
    forming a first PHS layer for heat dispersion opposite a region of the rear surface of the semiconductor substrate and excluding the second chip separating groove; and
    forming a second PHS layer for heat dispersion in the second chip separating groove and on the first PHS layer.

3. A method of fabricating a semiconductor device comprising:
    preparing a semiconductor substrate having a front surface, a rear surface, and a thickness between the front surface and the rear surface, including forming a plurality of semiconductor elements on the front surface;
    forming a first chip separating groove, for separating the semiconductor substrate into a plurality of semiconductor chips, at a location of the semiconductor substrate, each semiconductor chip defined by the first chip separating groove including one of the semiconductor elements, the depth of the first chip separating groove being less than a first thickness;
    forming a first metallization layer on an internal surface of the first chip separating groove;
    polishing or thinning the semiconductor substrate at the rear surface such that the semiconductor substrate thickness becomes the first thickness;
    etching a region of the rear surface of the semiconductor substrate opposite the first chip separating groove until the first metallization layer is exposed, thereby forming a second chip separating groove;
    forming a second metallization layer on an internal surface of the second chip separating groove;
    forming a hard metallization layer opposite a region of the rear surface of the semiconductor substrate and in the second chip separating groove;
    forming a PHS metallization layer for heat dispersion opposite all of the rear surface of the semiconductor substrate and covering the hard metallization layer, the hard metallization layer being a metal harder than the PHS metallization layer;
    leveling a surface of the PHS metallization layer by polishing or thinning the PHS metallization layer until the hard metallization layer is exposed; and
    cutting through the first metallization layer, the second metallization layer, and the hard metallization layer at the first chip separating groove to form a plurality of semiconductor chips, each semiconductor chip comprising a part of the PHS metallization layer and a part of the hard metallization layer, the hard metallization layer being disposed along and beyond a complete circumference of a lateral surface of the PHS metallization layer.

4. The method of claim 3 comprising forming a buffer metallization layer of a metal softer than the hard metallization layer opposite all of the rear surface of the semiconductor substrate and in the second chip separating groove, after forming the second metallization layer and before forming the hard metallization layer.

5. The method of claim 3 including:
    in forming the second chip separating groove, forming a resist opposite the rear surface of the semiconductor substrate, and not at a region opposite the first chip separating groove, the resist being used as a mask, and etching the semiconductor substrate until the first metallization layer is exposed;
    in forming the second metallization layer on the internal surface of the second chip separating groove, selectively plating, using the resist as a mask;
    forming a buffer metallization layer of a metal softer than the hard metallization layer, on the second metallization layer, after forming the second metallization layer and before forming the hard metallization layer; and
    in forming the hard metallization layer on the buffer metallization layer, selectively plating, using the resist as a mask and, subsequently, removing the resist.

6. The method of claim 3 wherein the hard metallization layer comprises Au—Sn alloy.

7. The method of claim 1 wherein:
    the first metallization layer comprises a Ti layer, a Pd layer, and an Au layer successively laminated; and
    in forming the second metallization layer, the Pd layer is exposed by etching the Ti layer in the second chip separating groove and, then, forming the second metallization layer comprising one of Ni and Ni based alloy by non-electrolytic plating, using the Pd layer as an activating layer.

8. The method of claim 3 wherein:

the first metallization layer comprises a Ti layer, a Pd layer, and an Au layer successively laminated; and in forming the second metallization layer, the Pd layer is exposed by etching the Ti layer layer exposed in the second chip separating groove and, then, forming the second metallization layer comprising one Ni and Ni based alloy by Ni based, non-electrolytic plating using the Pd layer as an activating layer.

9. A method of fabricating a semiconductor device comprising:

preparing a semiconductor substrate having a front surface, a rear surface, and a thickness between the front surface and the rear surface, including forming a plurality of semiconductor elements on the front surface;

forming a first chip separating groove, for separating the semiconductor substrate into a plurality of semiconductor chips, at a location of the semiconductor substrate, each semiconductor chip defined by the first chip separating groove including one of the semiconductor elements, the depth of the first chip separating groove being less than a first thickness forming a first metallization layer on an internal surface of the first chip separating groove;

polishing or thinning the semiconductor substrate at the rear surface such that the semiconductor substrate thickness becomes the first thickness;

forming a first electrical supply layer on all of the rear surface of the semiconductor substrate and, subsequently, forming a first PHS metallization layer for heat dispersion on the first electrical supply layer, except a region opposite the first chip separating groove, by electrolytic plating;

etching the first electrical supply layer and the semiconductor substrate opposite the first chip separating groove, using the first PHS layer as a mask, until the first metallization layer is exposed, thereby forming a second chip separating groove;

forming a second electrical supply layer on the first PHS metallization layer and in the second chip separating groove;

forming a second PHS metallization layer on the second electrical supply layer by electrolytic plating; and cutting through the first metallization layer, the second electrical supply layer, and the second PHS metallization layer at the first chip separating groove to form a plurality of semiconductor chips, each semiconductor chip comprising a part of the first and second PHS metallization layers disposed opposite the rear surface of the semiconductor substrate.

10. The method of claim 9 wherein the first electrical supply layer comprises Ti and Au laminated successively, including etching the first electrical supply layer by wet etching and, subsequently, etching the semiconductor substrate.

11. The method of claim 9 wherein the second electrical supply layer comprises one of Ni and Ni—P and its thickness is 3–5 μm.

12. A method of fabricating a semiconductor device comprising:

preparing a semiconductor substrate having a front surface, a rear surface, and a thickness between the front surface and the rear surface, including forming a plurality of semiconductor elements on the front surface;

forming a first chip separating grooves for separating the semiconductor substrate into a plurality of semiconductor chips, at a location of the semiconductor substrate, each semiconductor chip defined by the first chip separating groove including one of the semiconductor elements, the depth of the first chip separating groove being less than a first thickness;

forming a first metallization layer on an internal surface of the first chip separating groove;

polishing or thinning the semiconductor substrate at the rear surface such that the semiconductor substrate thickness becomes the first thickness;

forming a first electrical supply layer on all of the rear surface of the semiconductor substrate and, subsequently, forming a plating metallization layer by electrolytic plating on the first electrical supply layer, except on a region opposite the first chip separating groove;

etching the first electrical supply layer and the semiconductor substrate opposite the first chip separating groove until the first metallization layer is exposed, using the plating metallization layer as a mask, thereby forming a second chip separating groove;

forming a second electrical supply layer on the plating metallization layer and in the second chip separating groove and, subsequently, forming a buffer metallization layer on the second electrical supply layer;

forming a second metallization layer, opposite the second chip separating groove on the buffer metallization layer, the second metallization layer being harder than the buffer metallization layer;

forming a first PHS metallization layer for heat dispersion on the buffer metallization layer, except opposite the second chip separating groove region, the second PHS metallization layer being harder than the PHS metallization layer;

forming a second PHS metallization layer for heat dispersion on the second metallization layer and the first PHS metallization layer; and cutting through the first metallization layer, the buffer metallization layer, the second metallization layer, and the second PHS metallization layer at the first chip separating groove to form a plurality of semiconductor chips, each semiconductor chip comprising a part of the first and second PHS metallization layers.

13. A method of fabricating a semiconductor device comprising:

preparing a semiconductor substrate having a front surface, a rear surface, and a thickness between the front surface and the rear surface, including forming a plurality of semiconductor elements on the front surface;

forming a first chip separating groove, for separating the semiconductor substrate into a plurality of semiconductor chips, at a location of the semiconductor substrate, each semiconductor chip defined by the first chip separating groove including one of the semiconductor elements, the depth of the first chip separating groove being less than a first thickness;

forming a first metallization layer on an internal surface of the first chip separating groove;

polishing or thinning the semiconductor substrate at the rear surface such that the semiconductor substrate thickness becomes the first thickness;

forming an electrical supply layer on all of the rear surface of the semiconductor substrate and, subsequently, forming a PHS metallization layer for heat dispersion, by electrolytic plating, on the electrical supply layer, except on a region opposite the first chip separating groove; etching the electrical supply layer and the semiconductor substrate opposite the first chip separating groove using the PHS metallization layer as a mask, until the first metallization layer is exposed, thereby forming a second chip separating groove;

filling the second chip separating groove with a ceramic paste and drying the ceramic paste;

leveling the ceramic paste by polishing or trimming the ceramic paste until the PHS metallization layer opposite the semiconductor substrate is exposed;

forming a ceramic layer by curing the ceramic paste by heat treatment; and cutting through the first metallization layer and the ceramic layer at the first chip separating groove to form a plurality of semiconductor chips, each semiconductor chip comprising a part of the PHS metallization layer and the ceramic layer disposed along and beyond a complete circumference of the PHS metallization layer.

14. A method of fabricating a semiconductor device comprising:

preparing an epitaxial layer structure having a front surface and a rear surface and comprising a semiconductor substrate, an etch stopping layer disposed on the semiconductor substrate, and an epitaxial layer disposed on the etch stopping layer, the epitaxial layer being the front surface, and the surface of the semiconductor substrate opposite the etch stopping layer being the rear surface, and forming a plurality of semiconductor elements in the epitaxial layer at the front surface;

etching the epitaxial layer until the etch stopping layer is exposed to form a chip separating groove for separating the epitaxial layer structure into a plurality of semiconductor chips at a location on the epitaxial layer structure, each semiconductor chip defined by the chip separating groove including a semiconductor element;

forming a metallization layer on an internal surface of the chip separating groove;

removing the semiconductor substrate by etching at the rear surface, the etching stopping when the etch stopping layer is exposed;

removing the etch stopping layer and, subsequently, removing a region of the epitaxial layer to expose the metallization layer;

forming a PHS metallization layer for heat dispersion on the epitaxial layer exposed by removing the etch stopping layer and on the metallization layer; and cutting through the metallization layer and the PHS metallization layer at the chip separating groove to form a plurality of semiconductor chips, each semiconductor chip comprising a part of the PHS metallization layer.

15. The method of claim 1 wherein the first metallization layer comprises a laminated Ti layer and Au layer, including, in forming the second chip separating groove, etching the semiconductor substrate and, subsequently, etching and removing the exposed Ti layer of the first metallization layer, thereby exposing the Au layer in the second chip separating groove.

16. The method of claim 3 wherein the first metallization layer comprises a laminated Ti layer and Au layer, including, in forming the second chip separating groove, etching the semiconductor substrate and, subsequently, etching and removing the exposed Ti layer of the first metallization layer, thereby exposing the Au layer in the second chip separating groove.

17. The method of claim 9 wherein the first metallization layer comprises a laminated Ti layer and Au layer, including, in forming the second chip separating groove, etching the semiconductor substrate and, subsequently, etching and removing the exposed Ti layer of the first metallization layer, thereby exposing the Au layer in the second chip separating groove.

18. The method of claim 12 wherein the first metallization layer comprises a laminated Ti layer and Au layer, including, in forming the second chip separating groove, etching the semiconductor substrate and, subsequently, etching and removing the exposed Ti layer of the first metallization layer, thereby exposing the Au layer in the second chip separating groove.

19. The method of claim 13 wherein the first metallization layer comprises a laminated Ti layer and Au layer, including, in forming the second chip separating groove, etching the semiconductor substrate and, subsequently, etching and removing the exposed Ti layer of the first metallization layer, thereby exposing the Au layer in the second chip separating groove.

20. The method of claim 1 wherein the PHS metallization layer comprises one of Au and Cu.

21. The method of claim 3 wherein the PHS metallization layer comprises one of Au and Cu.

22. The method of claim 9 wherein one of the first PHS metallization layer and the second PHS metallization layer comprises one of Au and Cu.

23. The method of claim 12 wherein one of the first PHS metallization layer and the second PHS metallization layer comprises one of Au and Cu.

24. The method of claim 13 wherein the PHS metallization layer comprises one of Au and Cu.

25. The method of claim 14 wherein the PHS metallization layer comprises one of Au and Cu.

26. The method of claim 1 wherein the second metallization layer comprises one of Ni and Ni—P alloy.

27. The method of claim 3 wherein the second metallization layer comprises one of Ni and Ni—P alloy.

28. The method of claim 12 wherein the second metallization layer comprises one of Ni and Ni—P alloy.

29. The method of claim 4 wherein one of the PHS metallization layer and the buffer metallization layer comprises one of Au and Cu.

30. The method of claim 5 wherein one of the PHS metallization layer and the buffer metallization layer comprises one of Au and Cu.

31. The method of claim 12 wherein one of the plating metallization layer and the buffer metallization layer comprises one of Au and Cu.

* * * * *